(12) United States Patent
Isozaki

(10) Patent No.: US 9,432,048 B2
(45) Date of Patent: Aug. 30, 2016

(54) D/A CONVERSION CIRCUIT, OSCILLATOR, ELECTRONIC APPARATUS, AND MOVING OBJECT

(71) Applicant: Seiko Epson Corporation, Tokyo (JP)

(72) Inventor: Shigenori Isozaki, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/995,438

(22) Filed: Jan. 14, 2016

(65) Prior Publication Data

US 2016/0211859 A1 Jul. 21, 2016

(30) Foreign Application Priority Data

Jan. 19, 2015 (JP) ................................. 2015-007934

(51) Int. Cl.
*H03M 1/66* (2006.01)
*H03B 5/02* (2006.01)
*H01L 27/06* (2006.01)

(52) U.S. Cl.
CPC ............ *H03M 1/66* (2013.01); *H01L 27/0629* (2013.01); *H03B 5/02* (2013.01)

(58) Field of Classification Search
CPC .... H03B 5/02; H01L 27/0629; H03M 1/185; H03M 1/661; H03M 1/66; H03M 1/808; H03M 1/46; H03M 2201/2291; H03M 2201/30
USPC ................................. 341/153, 144, 139, 136
See application file for complete search history.

(56) References Cited

U.S. PATENT DOCUMENTS

| | | | | | |
|---|---|---|---|---|---|
| 4,641,131 | A | * | 2/1987 | Demmer | H03M 1/066 341/136 |
| 6,414,619 | B1 | * | 7/2002 | Swanson | H03M 1/185 341/139 |
| 8,059,140 | B2 | * | 11/2011 | Kwon | G09G 3/2011 345/690 |
| 8,723,294 | B2 | | 5/2014 | Yamamura | |
| 2011/0241920 | A1 | * | 10/2011 | Mori | H03M 1/1061 341/153 |
| 2012/0097910 | A1 | | 4/2012 | Yamamura | |

FOREIGN PATENT DOCUMENTS

| | | |
|---|---|---|
| JP | 2012-109535 A | 6/2012 |
| JP | 2012-222302 A | 11/2012 |

* cited by examiner

*Primary Examiner* — Jean B Jeanglaude
(74) *Attorney, Agent, or Firm* — Harness, Dickey & Pierce, P.L.C.

(57) ABSTRACT

A D/A conversion circuit includes a plurality of resistors connected to each other in series, a plurality of MOS transistors connected to each other so as to correspond to a plurality of contacts, and a plurality of dummy electrodes respectively disposed on sides opposite to the plurality of MOS transistors with a resistive element interposed therebetween when seen in a plan view of a semiconductor substrate. Each of the dummy electrodes is set to be in a second potential state when a gate electrode of the MOS transistor disposed on a side opposite thereto with the resistive element interposed therebetween is in a first potential state, and is set to be in a first potential state when the gate electrode of the MOS transistor is in a second potential state.

18 Claims, 12 Drawing Sheets

| DIGITAL CODE BITS 10 TO 8 | 111 | 110 | 101 | 100 | 011 | 010 | 001 | 000 |
|---|---|---|---|---|---|---|---|---|
| P(8m-1), N(8m-1) | ON | ON | OFF | OFF | OFF | OFF | OFF | OFF |
| P(8m-3), N(8m-3) | OFF | OFF | ON | ON | OFF | OFF | OFF | OFF |
| P(8m-5), N(8m-5) | OFF | OFF | OFF | OFF | ON | ON | OFF | OFF |
| P(8m-7), N(8m-7) | OFF | OFF | OFF | OFF | OFF | OFF | ON | ON |

FIG. 2A

| DIGITAL CODE BITS 10 TO 8 | 111 | 110 | 101 | 100 | 011 | 010 | 001 | 000 |
|---|---|---|---|---|---|---|---|---|
| P(8m-2), N(8m-2) | OFF | ON | ON | OFF | OFF | OFF | OFF | OFF |
| P(8m-4), N(8m-4) | OFF | OFF | OFF | ON | ON | OFF | OFF | OFF |
| P(8m-6), N(8m-6) | OFF | OFF | OFF | OFF | OFF | ON | ON | OFF |
| P(8m-8), N(8m-8) | ON | OFF | OFF | OFF | OFF | OFF | OFF | ON |

FIG. 2B

D/A CONVERSION CIRCUIT, OSCILLATOR, ELECTRONIC APPARATUS, AND MOVING OBJECT

BACKGROUND

1. Technical Field

The present invention relates to a D/A conversion circuit, an oscillator, an electronic apparatus, and a moving object.

2. Related Art

When a reduction in size and an increase in bits of a D/A converter are advanced in order to improve a resolving power of the converter, the area of a resistive element constituting a voltage dividing resistor hardly changes, but the number of switches each of which is constituted by a P-channel type MOS transistor and an N-channel type MOS transistor is increased, and thus the whole area is considerably increased. On the other hand, the P-channel type MOS transistor is used as a switch (PMOS switch) on a higher potential side than an intermediate potential, and the N-channel type MOS transistor is used as a switch (NMOS switch) on a lower potential side than the intermediate potential, and thus an area occupied by the switches can be halved, which allows a reduction in size and an increase in bits of the D/A converter to be achieved.

In this case, the number of switches selected in an on state in a PMOS switch group or an NMOS switch group is small, and most of the switches operate in an off state (gate electrodes of the PMOS switches are set to be in a high-potential state, and gate electrodes of the NMOS switches are set to be in a low potential). At this time, in the PMOS switch group, most of the gate electrodes are set to be in a high-potential state, the vicinity of most voltage dividing resistors close to the PMOS switches is set to be in a high-potential state. In addition, in the NMOS switch group, most of the gate electrodes are set to be in a low potential state, and thus the vicinity of most of the voltage dividing resistors close to the NMOS switches is set to be in a low-potential state.

When the inventors have carried out an experiment on a relationship between a resistance value of a resistor formed of polysilicon and potentials of wirings formed in wiring layers (ALA, ALB, ALC, and ALD disposed in ascending order of distance to the polysilicon layer) which are formed on the resistor, results as illustrated in FIG. 13 are obtained. In FIG. 13, a horizontal axis represents a potential of a wiring, and a vertical axis represents a resistance value of a resistor. From experiment results illustrated in FIG. 13, a resistance value becomes larger as the potential around the resistor becomes higher, and thus it can be understood that this tendency becomes more prominent as a distance between the resistor and the wiring becomes shorter.

Accordingly, in the D/A converter, it is considered that most of the voltage dividing resistors close to the PMOS switches have resistance values higher than their original resistance values because the vicinity thereof is set to be in a high-potential state, and most of the voltage dividing resistors close to the NMOS switches have resistance values lower than their original resistance values. For this reason, integral non-linearity (INL) of D/A conversion has a V shape with a central code as a boundary. In particular, when a resistive element constituting a voltage dividing resistor and a MOS switch are disposed to be as close as possible in order to achieve a reduction in size and an increase in bits, it can be understood that INL of D/A conversion has a V shape more prominently as illustrated in FIG. 14. Meanwhile, in FIG. 14, a horizontal axis represents a value in 16-bit digital codes which is input to a D/A converter, and a vertical axis represents INL.

As a solution of such a problem that a resistance value varies depending on a voltage difference, JP-A-2012-109535 proposes a resistive element capable of suppressing a variation in a resistance value by cancelling out a variation in a resistance value due to a voltage difference with respect to a semiconductor substrate in the vicinity of a resistive element layer, by a first conductive layer and a second conductive layer that cover at least one of a lower portion and an upper layer of the resistive element layer of which both ends are biased.

However, the resistive element disclosed in JP-A-2012-109535 cannot be used in a small and high-bit D/A converter because the layout area is increased by portions of the first conductive layer and the second conductive layer. In addition, in order to realize the resistive element disclosed in JP-A-2012-109535, it is necessary to form the first conductive layer or the second conductive layer, and thus a manufacturing cost is increased. In some cases, a manufacturing process may be required to be developed, and thus the application thereof cannot be easily performed.

SUMMARY

An advantage of some aspects of the invention is to provide a D/A conversion circuit capable of improving an integral nonlinear error, an oscillator, an electronic apparatus, and a moving object which use the D/A conversion circuit.

The invention can be implemented as the following forms or application examples.

Application Example 1

A D/A conversion circuit according to this application example includes a plurality of resistors that are constituted by a resistive element and a plurality of contacts provided in the resistive element, and are connected to each other in series, a plurality of MOS transistors that are connected to the plurality of contacts, respectively, and a plurality of dummy electrodes that are different from electrodes of the plurality of MOS transistors, which are respectively disposed on sides opposite to the plurality of MOS transistors with the resistive element interposed therebetween, when seen in a plan view of a semiconductor substrate. The plurality of resistors, the plurality of MOS transistors, and the plurality of dummy electrodes are formed on the semiconductor substrate. Each of the plurality of dummy electrodes is set to be in a second potential state when a gate electrode of the MOS transistor disposed on a side opposite thereto with the resistive element interposed therebetween is in a first potential state, and is set to be in a first potential state when the gate electrode of the MOS transistor is in a second potential state. One of the first potential and the second potential is a potential that allows electrical conduction of the MOS transistor, and the other is a potential that does not allow electrical conduction of the MOS transistor.

According to D/A conversion circuit of this application example, the potential of each of the plurality of dummy electrodes respectively disposed on the opposite sides to the plurality of MOS transistors with the resistive element interposed therebetween and the potential of each of gate electrodes of the plurality of MOS transistors have opposite phases (first potential and second potential), and thus the potentials act so as to cancel out an electrical field applied to each of the plurality of resistors formed in the resistive element. Accordingly, in this case, it is possible to improve the accuracy of an output voltage generated on the basis of voltage division by the plurality of resistors.

According to D/A conversion circuit of this application example, for example, when each resistor and each gate electrode or each dummy electrode are disposed so as to have a constant distance therebetween, there is a small difference in the influence on a resistance value of each resistor by the arrangement of the gate electrode even when the distance is reduced, and thus a reduction in size can be achieved.

Application Example 2

In the D/A conversion circuit according to the application example, each of the plurality of dummy electrodes may be formed of polysilicon.

According to this application example, when the plurality of resistors are formed in the same layer as polysilicon, an electrical field generated by potentials of the gate electrodes of the respective MOS transistors can be effectively cancelled out, and thus it is possible to realize the D/A conversion circuit which is highly accurate and is capable of being miniaturized.

Application Example 3

In the D/A conversion circuit according to the application example, a distance between the resistive element and the gate electrode of the MOS transistor may be equal to or less than 1 μm.

According to the D/A conversion circuit of this application example, each of the plurality of resistors is disposed to be closer to the MOS transistor as the degree to which the resistive element is contrary to a design rule becomes higher, and thus a reduction in size can be achieved.

Application Example 4

The D/A conversion circuit according to the application example may further include a control unit that controls a potential of each of the plurality of dummy electrodes.

Application Example 5

In the D/A conversion circuit according to the application example, each of the plurality of MOS transistors may be a P-channel type MOS transistor or an N-channel type MOS transistor. In a first resistor among the plurality of resistors, a terminal on a high potential side may be connected to the P-channel type MOS transistor, and a terminal on a low potential side may be connected to the N-channel type MOS transistor. In resistors on a higher potential side than the first resistor among the plurality of resistors, one side ends thereof may be connected to the P-channel type MOS transistors different from each other. In resistors on a lower potential side than the first resistor among the plurality of resistors, one side ends thereof may be connected to the N-channel type MOS transistors different from each other.

According to the D/A conversion circuit of this application example, a switch connected to a resistor on the higher potential side than the first resistor is constituted by a P-channel type MOS transistor, and a switch connected to a resistor on the lower potential side than the first resistor is constituted by an N-channel type MOS transistor, and thus it is possible to reduce a layout area for the switches by approximately half, compared to a case where all of the switches are constituted by a complementary analog switch (transfer gate). Therefore, in this case, it is possible to realize the D/A conversion circuit having a smaller size.

Application Example 6

In the D/A conversion circuit according to the application example, the resistors on the higher potential side than the first resistor may face the P-channel type MOS transistors connected to terminals on the low potential side. The resistors on the lower potential side than the first resistor may face the N-channel type MOS transistors connected to terminals on the high potential side.

According to the D/A conversion circuit of this application example, a well boundary between an N-well having the P-channel type MOS transistors formed therein and a P-well having the N-channel type MOS transistors formed therein is in the vicinity of the first resistor. Accordingly, the sum of the width of an N-well region and the width of a P-well region can be matched to the length of the resistive element in the longitudinal direction, and thus it is possible to reduce the layout area of the D/A conversion circuit.

Application Example 7

An oscillator according to this application example includes the D/A conversion circuit according to any one of the above-described application examples.

According to the oscillator of this application example, the D/A conversion circuit which is highly accurate and has a small size is used, and thus it is possible to realize the oscillator having a high accuracy of oscillating frequency and having a small size.

Application Example 8

An electronic apparatus according to this application example includes the D/A conversion circuit according to any one of the above-described application examples.

Application Example 9

A moving object according to this application example includes the D/A conversion circuit according to any one of the above-described application examples.

According to these application examples, the D/A conversion circuit which is highly accurate and has a small size is used, and thus it is possible to realize, for example, a highly-reliable electronic apparatus and moving object.

BRIEF DESCRIPTION OF THE DRAWINGS

The invention will be described with reference to the accompanying drawings, wherein like numbers reference like elements.

FIGS. 2A and 2B are truth tables showing a control logic of turn-on and turn-off of a MOS transistor.

DESCRIPTION OF EXEMPLARY EMBODIMENTS

Hereinafter, preferred embodiments of the invention will be described in detail with reference the accompanying drawings. Meanwhile, the embodiments described below are not unduly limited to the disclosure of the invention described in the appended claims. In addition, all the configurations described below are not necessarily essential components of the invention.

1. D/A Conversion Circuit

1-1. First Embodiment

Figure 1:
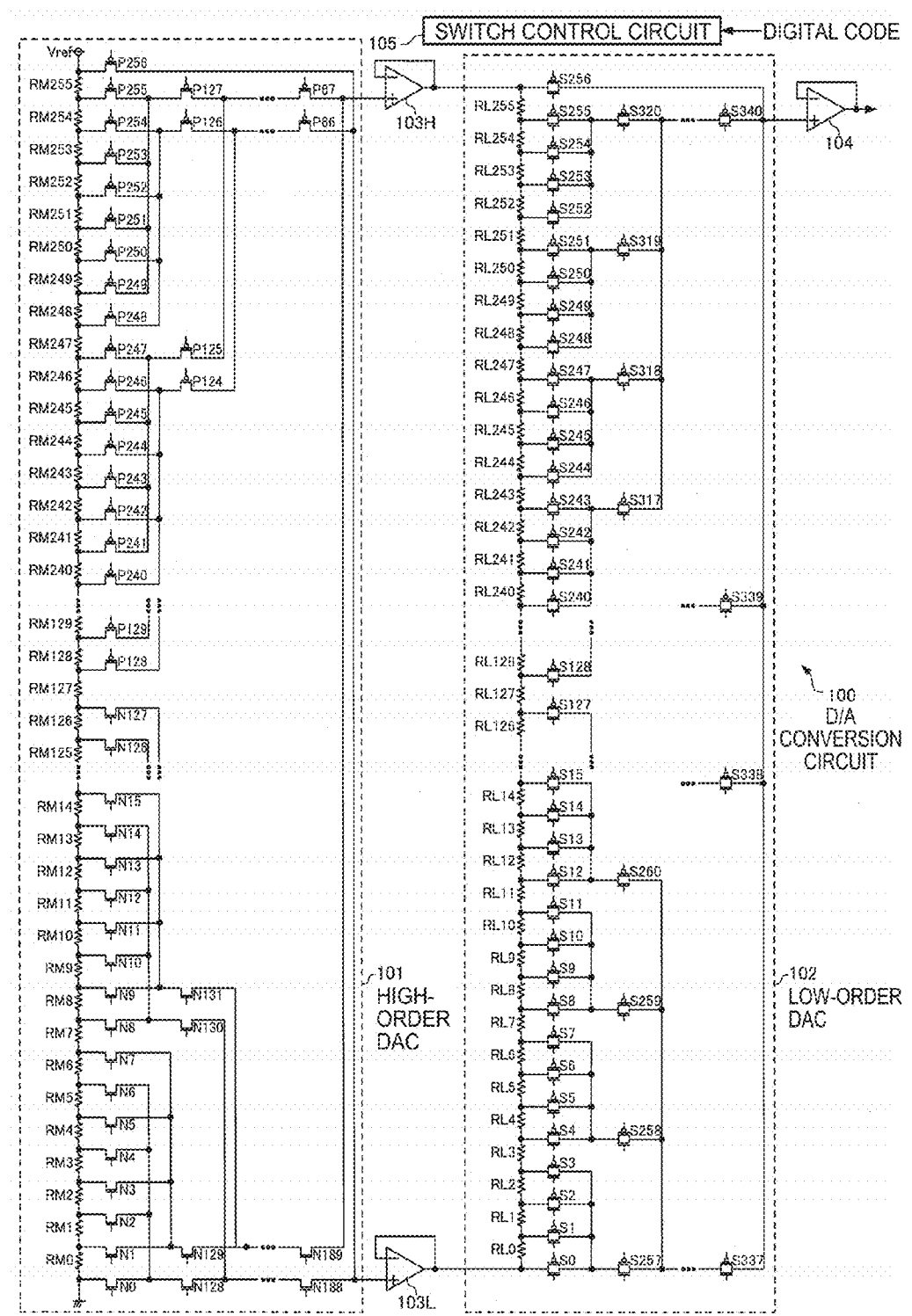
FIG. 1 is a diagram illustrating a configuration of a D/A conversion circuit according to a first embodiment.

FIG. 1 is a diagram illustrating a configuration of a D/A conversion circuit according to a first embodiment. A D/A conversion circuit 100 of the first embodiment is configured to include a high-order DAC 101, a low-order DAC 102, an operational amplifiers 103H, 103L, and 104, and a switch control circuit 105. The D/A conversion circuit 100 of the first embodiment is a resistance voltage division type (also referred to as a voltage distribution type, a resistance string type, or a voltage potential type) D/A conversion circuit, and outputs 65536 types of voltages depending on input values of 16-bit digital codes.

The high-order DAC 101 is configured to include 256 resistors RM0 to RM255, 191 P-channel type MOS transistors P66 to P256, and 190 N-channel type MOS transistors N0 to N189 which are formed on a semiconductor substrate.

The 256 resistors RM0 to RM255 (examples of a plurality of resistors) are connected to each other in series between a ground and a supply line of a reference voltage Vref.

In the resistor RM127 (example of a first resistor), a terminal on a high potential side is connected to a source of the P-channel type MOS transistor P128, and a terminal on a low potential side is connected to a drain of the N-channel type MOS transistor N127.

In each of the resistors RM(n) (n=128 to 255) on the higher potential side than the resistor RM127, one end (terminal on the low potential side) thereof is connected to a source of each of the P-channel type MOS transistors P(n), different from each other, which are located at a first stage, and the other end (terminal on the high potential side) thereof is connected to a source of each of the P-channel type MOS transistors P(n+1), different from each other, which are located at the first stage.

In each of the resistors RM(n) (n=1 to 126) on the lower potential side than the resistor RM127, one end (terminal on the low potential side) thereof is connected to a drain of each of the N-channel type MOS transistors N(n), different from each other, which are located at the first stage, and the other end (terminal on the high potential side) thereof is connected to a drain of each of the N-channel type MOS transistors N(n+1), different from each other, which are located at the first stage.

Here, 128 P-channel type MOS transistors P128 to P255 (examples of a plurality of MOS transistors), except for the P-channel type MOS transistor P256, which are located at the first stage have drains connected to each other for every four transistors on every other transistor from the high potential side, and are connected to the respective sources of 32 P-channel type MOS transistors P96 (not shown) to P127 located at a second stage. For example, the drains of four P-channel type MOS transistors P255, P253, P251, and P249 located at the first stage are connected to the source of the P-channel type MOS transistor P127 located at the second stage. In addition, the drains of four P-channel type MOS transistors P254, P252, P250, and P248 located at the first stage are connected to the source of the P-channel type MOS transistor P126 located at the second stage. In addition, the drains of four P-channel type MOS transistors P247, P245, P243, and P241 located at the first stage are connected to the source of the P-channel type MOS transistor P125 located at the second stage. In addition, the drains of four P-channel type MOS transistors P246, P244, P242, and P240 located at the first stage are connected to the source of the P-channel type MOS transistor P124 located at the second stage.

Here, 32 P-channel type MOS transistors P96 to P127 located at the second stage have drains connected to each other for every two transistors on every other transistor from the high potential side, and are connected to the respective sources of 16 P-channel type MOS transistors P80 to P95 (all of which are not shown in the drawing) which are located at a third stage. For example, the drains of two P-channel type MOS transistors P127 and P125 located at the second stage are connected to the source of the P-channel type MOS transistor P95 (not shown) which is located at the third stage. In addition, the drains of two P-channel type MOS transistors P126 and P124 located at the second stage are connected to the source of the P-channel type MOS transistor P94 (not shown) which is located at the third stage.

Hereinafter, similarly, 16 P-channel type MOS transistors P80 to P95 located at the third stage have drains connected to each other for every two transistors on every other transistor from the high potential side, and are connected to the respective sources of eight P-channel type MOS transistors P72 to P79 (all of which are not shown in the drawing) which are located at a fourth stage. In addition, eight P-channel type MOS transistors P72 to P79 located at the fourth stage have drains connected to each other for every two transistors on every other transistor from the high potential side, and are connected to the respective sources of four P-channel type MOS transistors P68 to P71 (all of which are not shown in the drawing) which are located at a fifth stage. In addition, four P-channel type MOS transistors P68 to P71 located at the fifth stage have drains connected to each other for every two transistors on every other transistor from the high potential side, and are connected to the respective sources of two P-channel type MOS transistors P66 and P67 located at a sixth stage.

Here, 128 N-channel type MOS transistors N0 to N127 (examples of a plurality of MOS transistors) which are located at the first stage have sources connected to each other for every four transistors on every other transistor from the low potential side, and are connected to the respective drains of 32 N-channel type MOS transistors N128 to N159 (not shown) which are located at the second stage. For example, the sources of four N-channel type MOS transistors N0, N2, N4, and N6 located at the first stage are connected to the drain of the N-channel type MOS transistor N128 located at the second stage. In addition, the sources of four N-channel type MOS transistors N1, N3, N5, and N7 located at the first stage are connected to the drain of the N-channel type MOS transistor N129 located at the second stage. In addition, the sources of four N-channel type MOS transistors N8, N10, N12, and N14 located at the first stage are connected to the drain of the N-channel type MOS transistor N130 located at the second stage. In addition, the sources of four N-channel type MOS transistor N9, N11, N13, and N15 located at the first stage are connected to the drain of the N-channel type MOS transistor N131 located at the second stage.

Here, 32 N-channel type MOS transistors N128 to N159 located at the second stage have sources connected to each other for every two transistors on every other transistor from the low potential side, and are connected to the respective drains of 16 N-channel type MOS transistors N160 to N175 (all of which are not shown in the drawing) which are located at the third stage. For example, the sources of two N-channel type MOS transistors N128 and N130 located at the second stage are connected to the drain of the N-channel type MOS transistor N160 (not shown) which is located at the third stage. In addition, the sources of two N-channel type MOS transistors N129 and N131 located at the second stage are connected to the source of the N-channel type MOS transistor N161 (not shown) which is located at the third stage.

Hereinafter, similarly, 16 N-channel type MOS transistors N160 to N175 located at the third stage have sources connected to each other for every two transistors on every other transistor from the low potential side, and are connected to the respective drains of eight N-channel type MOS transistors N176 to N183 (all of which are not shown in the drawing) which are located at the fourth stage. In addition, eight N-channel type MOS transistors N176 to N183 located at the fourth stage have sources connected to each other for every two transistors on every other transistor from the low potential side, and are connected to the respective drains of four N-channel type MOS transistors N184 to N187 (all of which are not shown in the drawing) which are located at the fifth stage. In addition, four N-channel type MOS transistors N184 to N187 located at the fifth stage have sources connected to each other for every two transistors for every other transistor from the low potential side, and are connected to the respective drains of two N-channel type MOS transistors N188 and N189 located at the sixth stage.

The drain of the P-channel type MOS transistor P67 located at the sixth stage is connected to the source of the N-channel type MOS transistor N189, and is connected to a non-inverting input terminal (positive terminal) of the operational amplifier 103H. In addition, the drain of the P-channel type MOS transistor P256 located at the first stage and the drain of the P-channel type MOS transistor P66 located at the sixth stage are connected to the source of the N-channel type MOS transistor N188, and are connected to a non-inverting input terminal (positive terminal) of the operational amplifier 103L.

Each of both the operational amplifiers 103H and 103L has an output terminal and an inverting input terminal (negative terminal) connected to each other, and functions as a voltage follower that propagates a voltage of a non-inverting input terminal (positive terminal) to the output terminal.

The switch control circuit 105 has 16-bit digital codes input thereto, and controls the turn-on and turn-off of 191 P-channel type MOS transistors P66 to P255 and 190 N-channel type MOS transistors N0 to N189 which are included in the high-order DAC 101 in accordance with the values of high-order 8 bits (bits 15 to 8) in the 16-bit digital codes (bits 15 to 0).

Only one of four P-channel type MOS transistors P(8m−1), P(8m−3), P(8m−5), and P(8m−7) (m=17 to 32), except for the P-channel type MOS transistor P256, which are located at the first stage is turned on. For example, only one of four P-channel type MOS transistors P255, P253, P251, and P249 is set to be in an on state, and the other three transistors are set to be in an off state. In addition, only of one four P-channel type MOS transistors P247, P245, P242, and P241 is set to be in an on state, and the other three transistors are set to be in an off state.

Similarly, only one of four P-channel type MOS transistors P(8m−2), P(8m−4), P(8m−6), and P(8m−8) (m=17 to 32) which are located at the first stage is turned on. For example, only one of four P-channel type MOS transistors P254, P252, P250, and P248 is set to be in an on state, and the other three transistors are set to be in an off state. In addition, only one of four P-channel type MOS transistors P246, P244, P242, and P240 is set to be in an on state, and the other three transistors are set to be in an off state.

In addition, only one of four N-channel type MOS transistors N(8m−1), N(8m−3), N(8m−5), and N(8m−7) (m=1 to 16) which are located at the first stage is turned on. For example, only one of four N-channel type MOS transistors N7, N5, N3, and N1 is set to be in an on state, and the other three transistors are set to be in an off state. In addition, only one of four N-channel type MOS transistors N15, N13, N11, and N9 is set to be in an on state, and the other three transistors are set to be in an off state.

Similarly, only one of four N-channel type MOS transistors N(8m−2), N(8m−4), N(8m−6), and N(8m−8) (m=1 to 16) which are located at the first stage is turned on. For example, only one of four N-channel type MOS transistors N6, N4, N2, and N0 is set to be in an on state, and the other three transistors are set to be in an off state. In addition, only one of four N-channel type MOS transistors N14, N12, N10, and N8 is set to be in an on state, and the other three transistors are set to be in an off state.

Here, 16 sets of four P-channel type MOS transistors P(8m−1), P(8m−3), P(8m−5), and P(8m−7) (m=17 to 32) and 16 sets of four N-channel type MOS transistors N(8m−1), N(8m−3), N(8m−5), and N(8m−7) (m=1 to 16) are all turned on and turned off by the same control logic. For example, two P-channel type MOS transistors P255 and P247 and two N-channel type MOS transistors N15 and N7 are simultaneously set to be in an on state or an off state.

Similarly, 16 sets of four P-channel type MOS transistors P(8m−2), P(8m−4), P(8m−6), and P(8m−8) (m=17 to 32) and 16 sets of four N-channel type MOS transistors N (8m−2), N(8m−4), N(8m−6), and N(8m−8) (m=1 to 16) are all turned on and turned off by the same control logic. For example, two P-channel type MOS transistors P254 and P246 and two N-channel type MOS transistors N14 and N6 are simultaneously set to be in an on state or an off state.

The switch control circuit 105 controls the turn-on and turn-off of 128 P-channel type MOS transistors P128 to P255 and 128 N-channel type MOS transistors N0 to N127 which are located at the first stage in accordance with 3-bit values of bits 10 to 8 in the digital codes. FIG. 2A is a truth table showing a control logic of the turn-on and turn-off of four P-channel type MOS transistors P(8m−1), P(8m−3), P(8m−5), and P(8m−7) (m=17 to 32) or four N-channel type MOS transistors N(8m−1), N(8m−3), N(8m−5), and N(8m−7) (m=1 to 16). In addition, FIG. 2B is a truth table showing a control logic of the turn-on and turn-off of four P-channel type MOS transistors P(8m−2), P(8m−4), P(8m−6), P(8m−8) (m=17 to 32) or four N-channel type MOS transistors N(8m−2), N(8m−4), N(8m−6), and N(8m−8) (m=1 to 16). According to the control logics shown in FIGS. 2A and 2B, two adjacent P-channel type MOS transistors are simultaneously set to be in an on state, and two adjacent N-channel type MOS transistors are simultaneously set to be in an on state. For example, when bits 10 to 8 in the digital codes are "111", two adjacent P-channel type MOS transistors P255 and P254 are simultaneously set to be in an on state, and two adjacent P-channel type MOS transistors P247 and P246 are also simultaneously set to be in an on state. Further, two adjacent N-channel type MOS transistors N15 and N14 are also simultaneously set to be in an on state, and two adjacent N-channel type MOS transistors N7 and N6 are also simultaneously set to be in an on state.

Potentials of terminals of two resistors disposed on the low potential side at intervals of 8 resistors out of 128 resistors RM128 to RM255 through 16 sets of two adjacent P-channel type MOS transistors, which are set to be in an on state, are supplied to each of 32 P-channel type MOS transistors P96 to P127 located at the second stage. Similarly, potentials of terminals of two resistors disposed on the low potential side at intervals of 8 resistors out of 128 resistors RM0 to RM127 through 16 sets of two adjacent N-channel type MOS transistors, which are set to be in an on state, are supplied to each of 32 N-channel type MOS transistors N128 to N159 located at the second stage.

The switch control circuit 105 controls the turn-on and turn-off of 32 P-channel type MOS transistors P96 to P127 and 32 N-channel type MOS transistors N128 to N159 which are located at the second stage in accordance with a one-bit value of bit 11 in the digital code. Specifically, when bit 11 is 1, the switch control circuit 105 sets a MOS transistor (having a large number) on the high potential side to be in an on state and sets a MOS transistor (having a small number) on the low potential side to be in an off state with respect to each of 16 sets of two P-channel type MOS transistors having drains connected to each other and 16 sets of two N-channel type MOS transistors having sources connected to each other. In addition, when bit 11 is 0, the switch control circuit 105 sets a MOS transistor (having a large number) on the high potential side to be in an off state and sets a MOS transistor (having a small number) on the low potential side to be in an on state with respect to each of 16 sets of two P-channel type MOS transistors having drains connected to each other and 16 sets of two N-channel type MOS transistors having sources connected to each other.

The switch control circuit 105 controls the turn-on and turn-off of MOS transistors located at the third, fourth, and fifth stages in accordance with each 1-bit value of bits 12 to 14 in the digital codes, by the same logic as that used to control the turn-on and turn-off of the MOS transistors located at the second stage.

When 8 bits of bits 15 to 8 in the digital codes are all 1, the switch control circuit 105 sets the P-channel type MOS transistor P256 located at the first stage to be in an on state, and sets the P-channel type MOS transistor P66 and the N-channel type MOS transistor N188 which are located at the sixth stage to be in an off state. In addition, when at least one of 8 bits of bits 15 to 8 in the digital codes is 0, the switch control circuit 105 sets the P-channel type MOS transistor P256 to be in an off state. When bit 15 in the digital code is 1, the switch control circuit sets the P-channel type MOS transistor P66 to be in an on state and sets the N-channel type MOS transistor N188 to be in an off state. When bit 15 is 0, the switch control circuit sets the P-channel type MOS transistor P66 to be in an off state and sets the N-channel type MOS transistor N188 to be in an on state.

In addition, when bit 15 in the digital code is 1, the switch control circuit 105 sets the P-channel type MOS transistor P67 located at the sixth stage to be in an on state and sets the N-channel type MOS transistor N189 to be in an off state. When bit 15 is 0, the switch control circuit sets the P-channel type MOS transistor P67 to be in an off state and sets the N-channel type MOS transistor N189 to be in an on state.

The high-order DAC 101 configured in this manner selects and outputs any two voltages (voltages at both ends of any of the resistors RM0 to RM255) in 257 types of voltages obtained by dividing a reference voltage Vref by the resistors RM0 to RM255 in accordance with high-order 8 bits (bits 15 to 8) in the digital codes, and supplies two reference voltages to the low-order DAC 102 through two operational amplifiers 103H and 103L. Meanwhile, when bit 8 in the digital code 0, an output voltage of the operational amplifier 103H becomes higher than an output voltage of the operational amplifier 103L. When bit 8 in the digital code is 1, an output voltage of the operational amplifier 103L becomes higher than an output voltage of the operational amplifier 103H.

The low-order DAC 102 is configured to include 256 resistors RL0 to RL255, and 341 complementary analog switches (transfer gates) S0 to S340 each of which is constituted by a P-channel type MOS transistor and an N-channel type MOS transistor.

The 256 resistors RL0 to RL255 are connected to each other in series between the output terminal of the operational amplifier 103L and the output terminal of the operational amplifier 103H.

In each resistor RL(k) (k=0 to 255), one end (terminal on the operational amplifier 103L side) thereof is connected to one end of each of the complementary analog switches S(k), different from each other, which are located at the first stage, and the other end (terminal on the operational amplifier 103H side) thereof is connected to one end of each of the complementary analog switches S(k+1), different from each other, which are located at the first stage.

Here, 256 complementary analog switches S0 to S255, except for the complementary analog switch S256, which are located at the first stage have other ends connected to each other for every four switches, and are connected to one end of each of 64 complementary analog switches S257 to S320 located at the second stage. For example, other ends of four complementary analog switches S255, S254, S253, and S252 located at the first stage are connected to one end of the complementary analog switch S320 located at the second stage.

Here, 64 complementary analog switches S257 to S320 located at the second stage have other ends connected to each other for every four switches, and are connected to one end of each of 16 complementary analog switches S321 to S336 (not shown) which are located at the third stage. For example, other ends of four complementary analog switches S320, S319, S318, and S317 located at the second stage are connected to one end of the complementary analog switch S336 (not shown) which is located at the third stage.

Hereinafter, similarly, 16 complementary analog switches S321 to S336 located at the third stage have other ends connected to each other for every four switches, and are connected to one end of each of four complementary analog switches S337 to S340 located at the fourth stage. In addition, the other end of the complementary analog switch S256 located at the first stage is connected to other ends of four complementary analog switches S337 to S340 located at the fourth stage, and is connected to a non-inverting input terminal (positive terminal) of the operational amplifier 104.

The operational amplifier 104 has an output terminal and an inverting input terminal (negative terminal) connected to each other, and functions as a voltage follower that propagates a voltage of a non-inverting input terminal (positive terminal) to the output terminal.

The switch control circuit 105 controls the turn-on and turn-off of 341 complementary analog switches S0 to S340 included in the low-order DAC 102 in accordance with the values of low-order 9 bits (bits 8 to 0) in the 16-bit digital codes (bits 15 to 0). Specifically, when bit 8 in the digital code is 0 (when the output voltage of the operational amplifier 103H is higher than the output voltage of the operational amplifier 103L), the switch control circuit 105 controls the turn-on and turn-off of the complementary analog switches S0 to S340 so that a voltage of one end (terminal on the operational amplifier 103L side) of the resistor RL(k) is propagated to the non-inverting input terminal (positive terminal) of the operational amplifier 104, in a case where 8 bits of bits 7 to 0 in the digital codes are k (k=0 to 255). In addition, when bit 8 in the digital code is 1 (when an output voltage of the operational amplifier 103L is higher than an output voltage of the operational amplifier 103H), the switch control circuit 105 controls the turn-on and turn-off of the complementary analog switches S0 to S340 so that a voltage of the other end (terminal on the operational amplifier 103H side) of the resistor RL(255-k) is propagated to the non-inverting input terminal (positive terminal) of the operational amplifier 104, in a case where 8 bits of bits 7 to 0 in the digital codes are k (k=0 to 255).

The low-order DAC 102 configured in this manner selects any one voltage in 256 types of voltages obtained by dividing a voltage between the output terminal of the operational amplifier 103H and the output terminal of the operational amplifier 103L by the resistors RL0 to RL255 in accordance with low-order 8 bits (bits 7 to 0) in the digital codes, and outputs the selected voltage to the outside of the D/A conversion circuit 100 through the operational amplifier 104.

Meanwhile, as described above, the output voltage of the operational amplifier 103H is higher than the output voltage of the operational amplifier 103L in accordance with the value of bit 8 in the digital code, or vice versa. For this reason, in the low-order DAC 102, a complementary analog switch is used instead of a switch constituted by either a P-channel type MOS transistor or an N-channel type MOS transistor.

The D/A conversion circuit 100 configured in this manner selects and outputs any one of $2^{16}$ (=65536) types of voltages divided from a reference voltage Vref in accordance with 16-bit digital codes.

As described above, in the high-order DAC 101 included in the D/A conversion circuit 100, 191 switches electrically connected to one side ends of resistors on a higher potential side than the resistor RM127 are all constituted by a P-channel type MOS transistor, and 190 switches electrically connected to one side ends of resistors on a lower potential side than the resistor RM127 are all constituted by an N-channel type MOS transistor. Accordingly, an area occupied by the switches on a semiconductor substrate is reduced to approximately a half, compared to a case where the 381 switches are all constituted by a complementary analog switch (transfer gate).

In addition, the accuracy of the output voltage of the high-order DAC 101 depends on not only resistance values of the respective resistors RM0 to RM255 but also differences between the resistance values. In the layout design of the high-order DAC 101, the resistors RM0 to RM255 are constituted by a resistive element and a plurality of contacts (equivalent to terminals of the respective resistors) which are provided in the resistive element. When a distance between the contacts is kept constant with the width of the resistive element kept constant, the resistors RL0 to RL255 can be made to have substantially the same (difference of approximately 0) resistance value. For this reason, the length of the resistive element can be matched to the width in a longitudinal direction of a region in which 257 MOS transistors located at the first stage are arranged. Accordingly, in order to make the layout area as small as possible while maintaining the output accuracy of the high-order DAC 101, it is important to efficiently dispose 257 MOS transistors located at the first stage with as small an area as possible.

For example, it is effective to set an interval between diffusion regions (source and drain) of two adjacent P-channel type MOS transistors or an interval between diffusion regions (source and drain) of two adjacent N-channel type MOS transistors to be a minimum value in a design rule or a value close to the minimum value. In addition, since the P-channel type MOS transistor and the N-channel type MOS transistor are respectively formed in an N-well and a P-well, it is effective to set an interval between an N-well terminal and a P-well terminal which are located between the P-channel type MOS transistor P128 and the N-channel type MOS transistor N127 which are respectively connected to both ends of the resistor RM127 to be a minimum value in a design rule or a value close to the minimum value. Further, it is preferable to dispose the contacts as the terminals of the respective resistors and the above-mentioned source contacts of the respective P-channel type MOS transistors or drain contacts of the respective N-channel type MOS transistors on the same straight line, in consideration of the efficiency of wirings (minimization of a wiring region) for connecting 256 resistors RM0 to RM255 and 257 MOS transistors located at the first stage.

Figure 3:
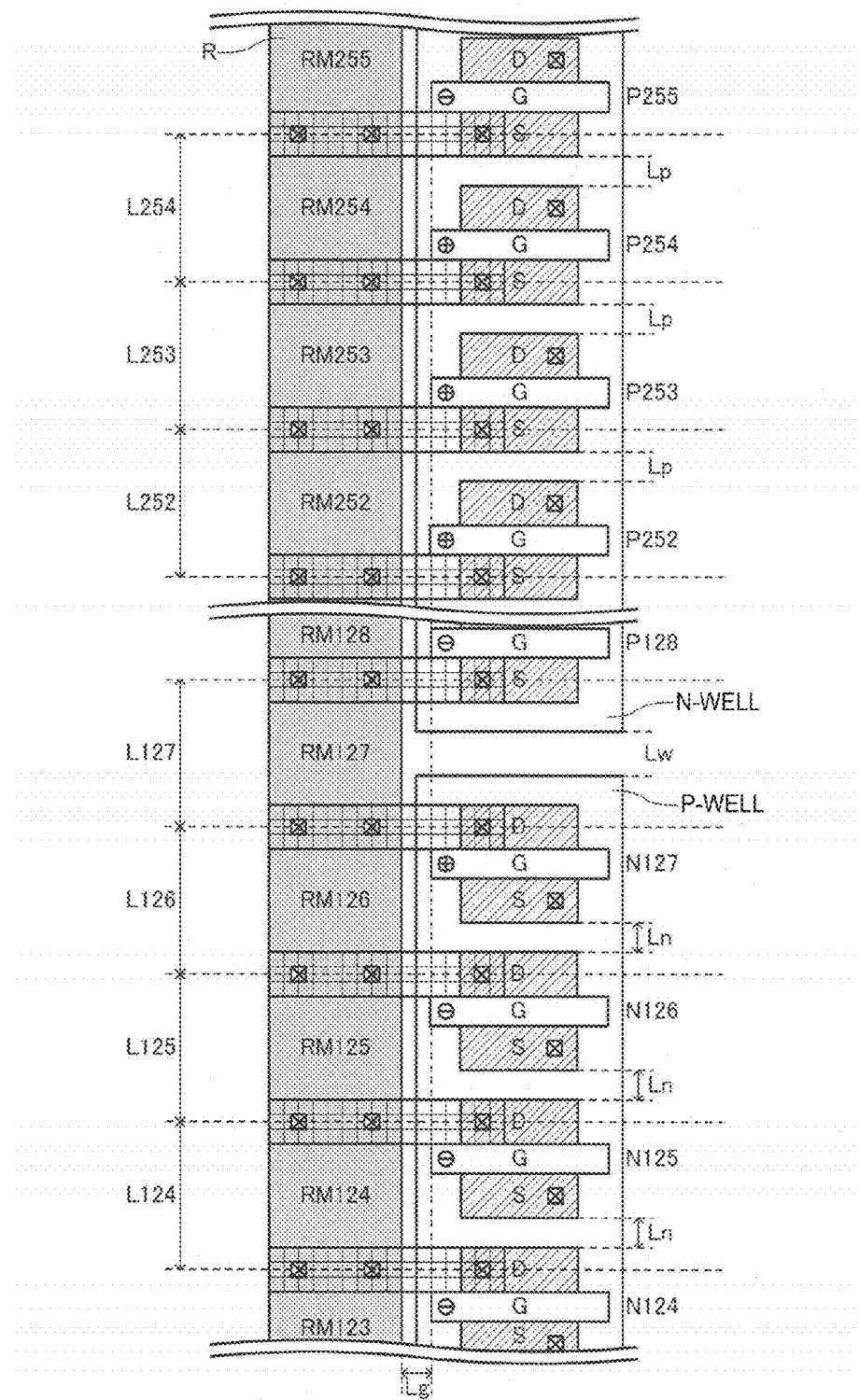
FIG. 3 is a diagram illustrating the layout of a portion of a D/A conversion circuit according to a comparative example.

When the layout design is performed in consideration of these conditions, the layout in the vicinity of the resistor RM253 and the vicinity of the resistor RM126 is as illustrated in FIG. 3. In FIG. 3, an interval Lp (interval between the source of the P-channel type MOS transistor P255 and the drain of the P-channel type MOS transistor P254, or the like) between a source and a drain of two adjacent P-channel type MOS transistors or an interval Ln (interval between the source of the N-channel type MOS transistor N127 and the drain of the N-channel type MOS transistor N126, or the like) between a source and a drain of two adjacent N-channel type MOS transistors is set to be a minimum value in a design rule or a value close to the minimum value. In addition, an interval Lw between an N-well having the P-channel type MOS transistors P255, P254, and the like formed therein and a P-well having the N-channel type MOS transistors N127, N126, and the like formed therein is also set to be a minimum value in a design rule or a value close to the minimum value. In addition, a length (distance between contacts) L254 of the resistor RM254 formed on a resistive element R, a length L253 of the resistor RM253, a length L254 of the resistor RM252, a length L127 of the resistor RM127, a length L126 of the resistor RM126, a length L125 of the resistor RM125, and a length L124 of the resistor RM124 are all set to have the same value.

Meanwhile, a positional relationship between a resistor RM(n) (n=129 to 251) and a P-channel type MOS transistor P(n) is also the same as a positional relationship between the resistor RM255 and the P-channel type MOS transistor P255. Similarly, a positional relationship between a resistor RM(n) (n=0 to 122) and an N-channel type MOS transistor N(n+1) is also the same as a positional relationship between the resistor RM126 and the N-channel type MOS transistor N127.

Figure 4:
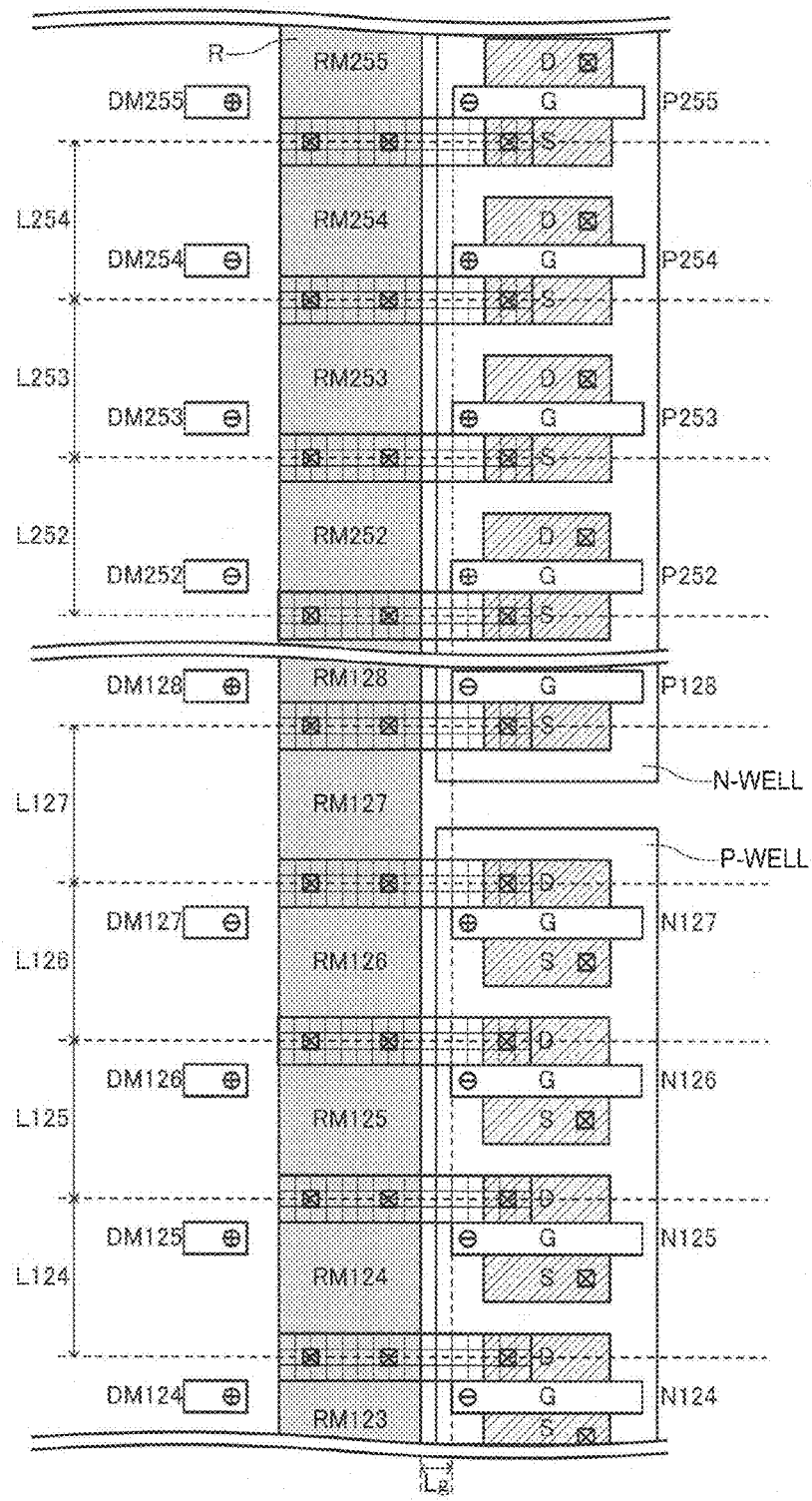
FIG. 4 is a diagram illustrating the layout of a portion of the D/A conversion circuit according to the first embodiment.

Here, for example, when bits 10 to 8 in the digital codes are "111", the P-channel type MOS transistors P255 and P128 and the N-channel type MOS transistor N127 are set to be in an on state in accordance with the truth tables of FIGS. 2A and 2B, and the P-channel type MOS transistors P254, P253, and P252 and the N-channel type MOS transistors N126, N125, and N124 are set to be in an off state. That is, the P-channel type MOS transistors P255 and P128 having gate electrodes being set to be in an L level (an example of a first potential) allow electrical conduction between the source and drain thereof, and the P-channel type MOS transistors P254, P253, and P252 having gate electrodes being set to be in an H level (an example of a second potential) do not allow electrical conduction between the source and drain thereof. In addition, the N-channel type MOS transistor N127 has a gate electrode being set to be in an H level allows electrical conduction between the drain and source thereof, and the N-channel type MOS transistors N126, N125, and N124 having gate electrodes being set to be in an L level do not allow electrical conduction between the drain and source thereof. FIG. 4 illustrates a state where bits 10 to 8 in the digital codes are "111" by attaching sign "+" to a gate electrode set to be in an H level and attaching sign "−" to a gate electrode set to be in an L level.

Figure 13:
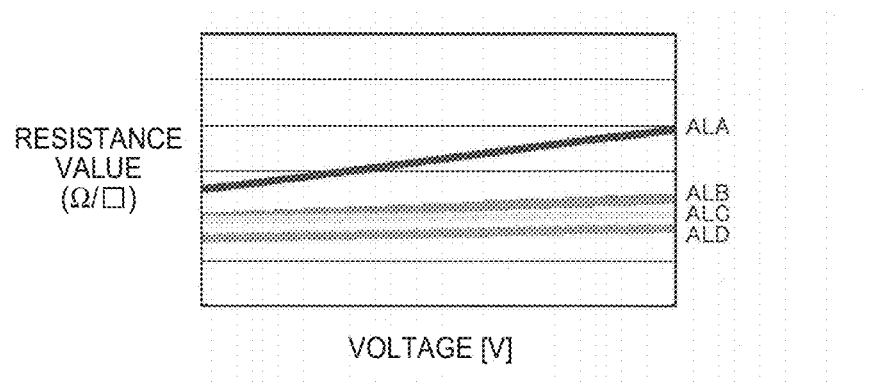
FIG. 13 is a diagram illustrating experiment results on a relationship between a resistance value of a resistor formed of polysilicon and a potential of a wiring formed in a wiring layer formed on the resistor.
Figure 14:
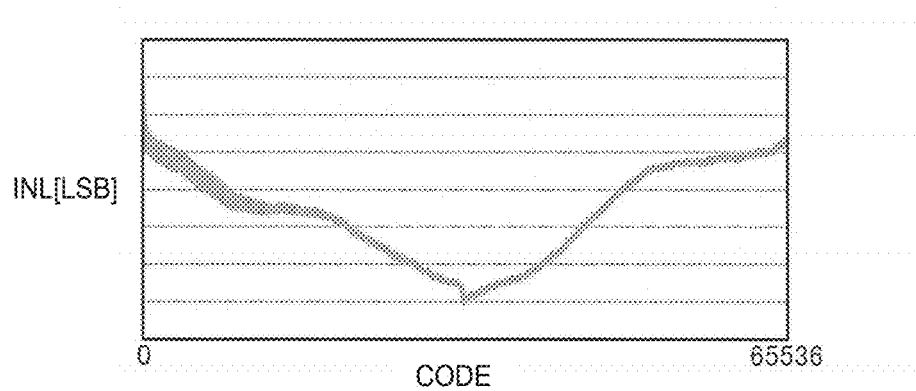
FIG. 14 is a diagram illustrating a deterioration in INL of D/A conversion.

At this time, as illustrated in FIG. 4, the potentials of gate electrodes disposed so as to respectively face the resistors RM255, RM128, RM125, RM124, and RM123 are set to be in an L level, while the potentials of gate electrodes disposed so as to respectively face the resistors RM254, RM253, RM252, and RM126 are set to be in an H level. In this case, according to experiment results illustrated in FIG. 13, when bits 10 to 8 in the digital codes are "111", it is considered that the resistance values of the resistors RM254, RM253, RM252, and RM126 become higher than the resistance values of the resistors RM255, RM128, RM125, RM124, and RM123 under the influence of an electrical field. The potential of each gate electrode varies depending on the values of bits 10 to 8 in the digital codes. However, with respect to any code value, a quarter of all of the gate electrodes of the P-channel type MOS transistors are set to be in an L level, while three-quarters of the gate electrodes of the P-channel type MOS transistors are set to be in an H level. Similarly, with respect to any code value, a quarter of all of the gate electrodes of the N-channel type MOS transistors are set to be in an H level, while three-quarters of the gate electrodes of the N-channel type MOS transistors are set to be in an L level. In this case, as illustrated in FIG. 14, INL of the high-order DAC 101 has a V shape. As a result, the output accuracy of the D/A conversion circuit 100 deteriorates.

Consequently, in the present embodiment, as illustrated in FIG. 4, each of dummy electrodes DM128 to DM255 different from electrodes of the P-channel type MOS transistors P128 to P255 is disposed on the opposite side to each of the P-channel type MOS transistors P128 to P255 with the resistive element R interposed therebetween when seen in a plan view of the semiconductor substrate. Similarly, each of dummy electrodes DM0 to DM127 different from electrodes of the N-channel type MOS transistors N0 to N127 is disposed on the opposite side to each of the N-channel type MOS transistors N0 to N127 with the resistive element R interposed therebetween when seen in a plan view of the semiconductor substrate. It is preferable that each of the dummy electrodes DM0 to DM255 is disposed at a position facing each gate electrode located on the opposite side with the resistive element R interposed therebetween so that an interval between each dummy electrode and the resistive element R becomes the same as an interval between each gate electrode and the resistive element R, when seen in a plan view of the semiconductor substrate. In addition, it is preferable that the dummy electrodes DM0 to DM255 are formed in the same layers (for example, polysilicon layers) as the respective gate electrodes.

The switch control circuit 105 (an example of a control unit) controls so that each of the dummy electrodes DM0 to DM255 is set to be in an H level when the gate electrode of the MOS transistor disposed on the opposite side with the resistive element R interposed therebetween is in an L level and is set to be in an L level when the gate electrode of the MOS transistor is in an H level, that is, so that potentials of opposite phases are applied to the dummy electrode and the gate electrode facing each other with the resistive element R interposed therebetween. Here, the potentials of four dummy electrodes DM(4m−1), DM(4m−2), DM(4m−3), and DM(4m−4) (m=33 to 64) are always the same as the potentials of gate electrodes of four N-channel type MOS transistors N(4m−129), N(4m−130), N(4m−131), and N(4m−132). In addition, the potentials of four dummy electrodes DM(4m−1), DM(4m−2), DM(4m−3), and DM(4m−4) (m=1 to 32) are always the same as the potentials of gate electrodes of four P-channel type MOS transistors P(4m+127), P(4m+126), P(4m+125), and P(4m+124). Accordingly, a signal for controlling the potentials of the dummy electrodes DM0 to DM255 can also serve as a signal for controlling the turn-on and turn-off of the P-channel type MOS transistors or a signal for controlling the turn-on and turn-off of the N-channel type MOS transistors.

In this manner, a dummy electrode is disposed at a position facing a gate electrode of each MOS transistor with the resistive element R interposed therebetween, and the dummy electrode and the gate electrode facing each other with the resistive element R interposed therebetween are set to be in opposite-phase potential states, and thus an electrical field applied to each resistor can be cancelled out, which allows a deviation between resistance values of the resistors RM0 to RM255 which is caused by a difference in the electrical field to be reduced. Accordingly, INL of the high-order DAC 101 is improved, and a deterioration in the output accuracy of the D/A conversion circuit 100 is reduced.

In addition, the dummy electrodes DM0 to DM255 may be shorter than a gate electrode of each MOS transistor, and thus it is possible to suppress an increase in a layout area for disposing the dummy electrodes DM0 to DM255 by making the dummy electrodes DM0 to DM255 as small as possible. In addition, when the dummy electrodes DM0 to DM255 are disposed so that an interval between each dummy electrode and the resistive element R becomes the same as an interval between the opposite gate electrode and the resistive element R, an electrical field applied to each resistor can be cancelled out even when the interval (distance) Lg between the resistive element R and each gate electrode or the dummy electrode is set to be a value contrary to a design rule, and can be reduced to, for example, a value equal to or less than 1 μm. Thereby, it is possible to reduce the layout area of the D/A conversion circuit 100.

Figure 5:
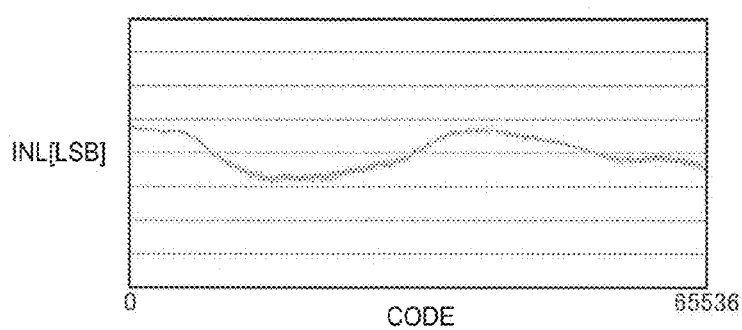
FIG. 5 is a diagram illustrating an example of actual measurement results of INL of the D/A conversion circuit according to the first embodiment.

FIG. 5 illustrates an example of actual measurement results of INL of the D/A conversion circuit 100 when layout is performed with an interval between the resistive element R and each gate electrode or each of the dummy electrodes DM0 to DM255 being set to be approximately 1 μm. In FIG. 5, a horizontal axis represents a value in 16-bit digital codes, and a vertical axis represents INL. As illustrated in FIG. 5, INL does not have a V shape with a central code (32768) as a boundary and is improved.

As described above, according to the D/A conversion circuit 100 of the first embodiment, a dummy electrode and a gate electrode facing each other with the resistive element R interposed therebetween are set to be in opposite-phase potential states in the high-order DAC 101, and thus an electrical field applied to each resistor is cancelled out, which allows a deviation between resistance values of the resistors RM0 to RM255 to be reduce. Therefore, according to the D/A conversion circuit 100 of the first embodiment, INL of the high-order DAC 101 is improved, and thus it is possible to improve the accuracy of an output voltage.

In addition, according to the D/A conversion circuit 100 of the first embodiment, the resistive element R can be disposed to be closer to the gate electrode of each MOS transistor or each dummy electrode as the degree of contravention of a design rule becomes higher, and thus a reduction in size can be achieved.

Therefore, according to the first embodiment, it is possible to realize the D/A conversion circuit which is highly accurate and has a small size.

1-2. Second Embodiment

Figure 6:
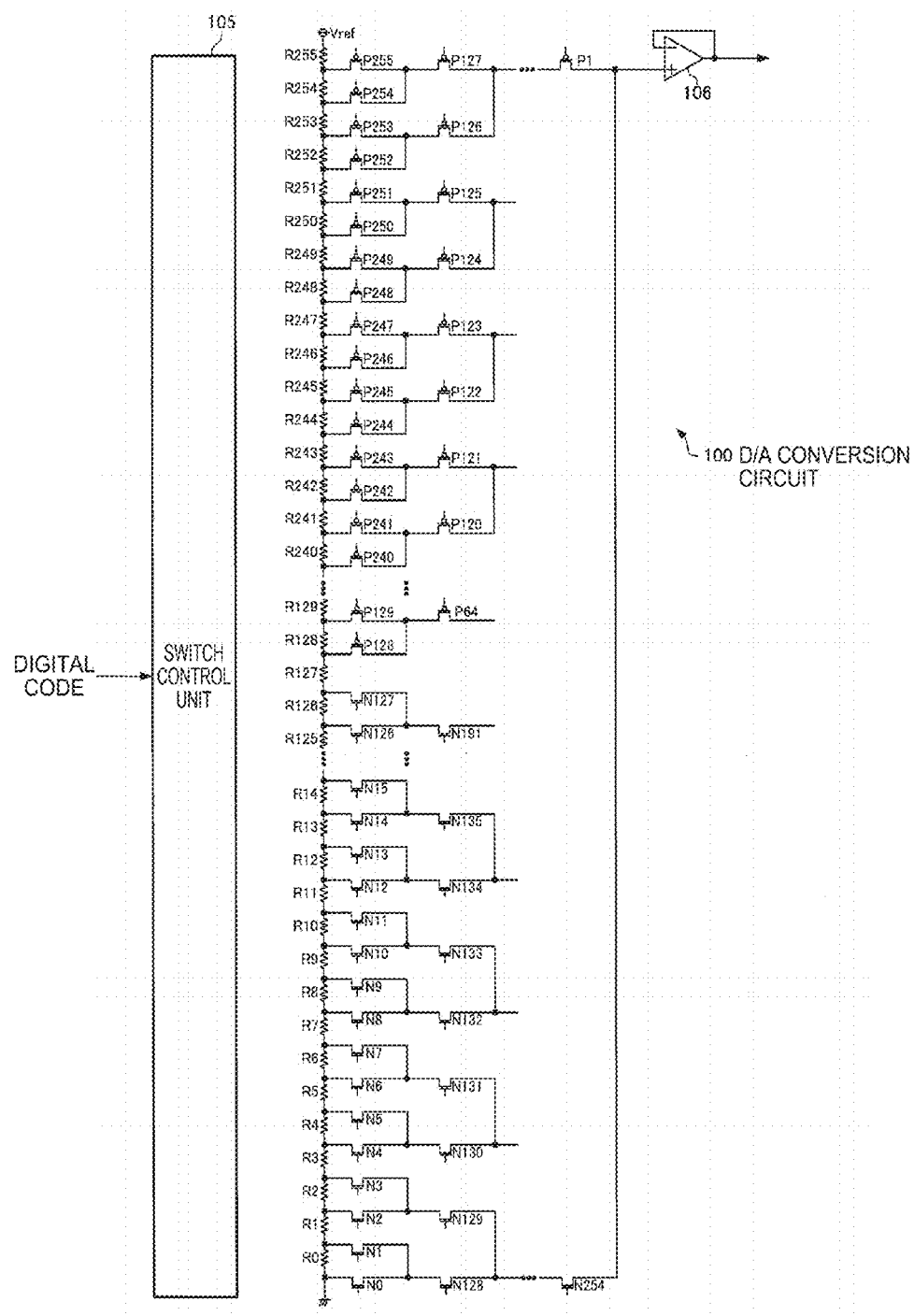
FIG. 6 is a diagram illustrating a configuration of a D/A conversion circuit according to a second embodiment.

FIG. 6 is a diagram illustrating a configuration of a D/A conversion circuit according to a second embodiment. A D/A conversion circuit 100 of the second embodiment is configured to include 256 resistors R0 to R255, 255 P-channel type MOS transistors P1 to P255, 255 N-channel type MOS transistors N0 to N254, a switch control circuit 105, and an operational amplifier 106. The D/A conversion circuit 100 of the second embodiment is a resistance voltage division type D/A conversion circuit, and outputs 256 types of voltages depending on input values of 8-bit digital codes.

Here, 256 resistors R0 to R255 (examples of a plurality of resistors) are connected to each other in series between a ground and a supply line of a reference voltage Vref.

In the resistor R127, a terminal on a high potential side is connected to a source of the P-channel type MOS transistor P128, and a terminal on a low potential side is connected to a drain of the N-channel type MOS transistor N127.

In each of the resistors R(n) (n=128 to 255) on the higher potential side than the resistor R127, one end (terminal on the low potential side) thereof is connected to a source of each of the P-channel type MOS transistors P(n), different from each other, which are located at a first stage, and the other end (terminal on the high potential side) thereof is connected to a source of each of the P-channel type MOS transistors P(n+1), different from each other, which are located at the first stage.

In each of the resistors R(n) (n=1 to 126) on the lower potential side than the resistor R127, one end (terminal on the low potential side) thereof is connected to a drain of each of the N-channel type MOS transistors N(n), different from each other, which are located at the first stage, and the other end (terminal on the high potential side) thereof is connected to a drain of each of the N-channel type MOS transistors N(n+1), different from each other, which are located at the first stage.

Here, 128 P-channel type MOS transistors P128 to P255 (examples of a plurality of MOS transistors) which are located at the first stage have drains connected to each other for every two transistors from the high potential side, and are connected to the respective sources of 64 P-channel type MOS transistors P64 to P127 located at a second stage. For example, the drains of two P-channel type MOS transistors P255 and P254 located at the first stage are connected to the source of the P-channel type MOS transistor P127 located at the second stage. In addition, the drains of two P-channel type MOS transistors P253 and P252 located at the first stage are connected to the source of the P-channel type MOS transistor P126 located at the second stage.

Hereinafter, similarly, 64 P-channel type MOS transistors P64 to P127 located at the second stage have drains connected to each other for every two transistors from the high potential side, and connected to the respective sources of 32 P-channel type MOS transistors P32 to P63 (all of which are not shown in the drawing) which are located at a third stage. In addition, 32 P-channel type MOS transistors P32 to P63 located at the third stage have drains connected to each other for every two transistors from the high potential side, and connected to the respective sources of 16 P-channel type MOS transistors P16 to P31 (all of which are not shown in the drawing) which are located at a fourth stage. In addition, 16 P-channel type MOS transistors P16 to P31 located at the fourth stage have drains connected to each other for every two transistors from the high potential side, and are connected to the respective sources of eight P-channel type MOS transistors P8 to P15 (all of which are not shown in the drawing) which are located at a fifth stage. In addition, eight P-channel type MOS transistors P8 to P15 located at the fifth stage have drains connected to each other for every two transistors from the high potential side, and are connected to the respective sources of four P-channel type MOS transistors P4 to P7 (all of which are not shown in the drawing) which are located at a sixth stage. In addition, four P-channel type MOS transistors P4 to P7 located at the sixth stage have drains connected to each other for every two transistors from the high potential side, and are connected to the respective sources of two P-channel type MOS transistors P2 and P3 (all of which are not shown in the drawing) which are located at a seventh stage. In addition, two P-channel type MOS transistors P2 and P3 located at the seventh stage have drains connected to each other and are connected to the source of one P-channel type MOS transistor P1 located at an eighth stage.

Here, 128 N-channel type MOS transistors N0 to N127 (examples of a plurality of MOS transistors) which are located at the first stage have sources connected to each other for every two transistors from the low potential side, and are connected to the respective drains of 64 N-channel type MOS transistors N128 to N191 which are located at the second stage. For example, the sources of two N-channel type MOS transistors N0 and N1 located at the first stage are connected to the drain of the N-channel type MOS transistor N128 located at the second stage. In addition, the sources of two N-channel type MOS transistors N2 and N3 located at the first stage are connected to the drain of the N-channel type MOS transistor N129 located at the second stage.

Hereinafter, similarly, 64 N-channel type MOS transistors N128 to N191 located at the second stage have sources connected to each other for every two transistors from the low potential side, and are connected to the respective drains of 32 N-channel type MOS transistors N192 to N223 (all of which are not shown in the drawing) which are located at the third stage. In addition, 32 N-channel type MOS transistors N192 to N223 located at the third stage have sources connected to each other for every two transistors from the low potential side, and are connected to the respective drains of 16 N-channel type MOS transistors N224 and N239 (all of which are not shown in the drawing) which are located at the fourth stage. In addition, 16 N-channel type MOS transistors N224 to N239 located at the fourth stage have sources connected to each other for every two transistors from the low potential side, and are connected to the respective drains of eight N-channel type MOS transistors N240 to N247 (all of which are not shown in the drawing) which are located at the fifth stage. In addition, eight N-channel type MOS transistors N240 to N247 located at the fifth stage have sources connected to each other for every two transistors from the low potential side, and are connected to the respective drains of four N-channel type MOS transistors N248 to N251 (all of which are not shown in the drawing) which are located at the sixth stage. In addition, four N-channel type MOS transistors N248 to N251 located at the sixth stage have sources connected to each other for every two transistors from the low potential side, and are connected to the respective drains of two N-channel type MOS transistors N252 and N253 (all of which are not shown in the drawing) which are located at the seventh stage. In addition, two N-channel type MOS transistors N252 and N253 located at the seventh stage have sources connected to each other, and are connected to the drain of one N-channel type MOS transistor N254 located at the eighth stage.

The drain of one P-channel type MOS transistor P1 located at the eighth stage are connected to the source of one N-channel type MOS transistor N254 located at the eighth stage, and are connected to a non-inverting input terminal (positive terminal) of the operational amplifier 106.

The operational amplifier 106 has an output terminal and an inverting input terminal (negative terminal) connected to each other, and functions as a voltage follower that propagates a voltage of a non-inverting input terminal (positive terminal) to the output terminal.

The switch control circuit 105 has 8-bit digital codes input thereto, and controls the turn-on and turn-off of 255 P-channel type MOS transistors P1 to P255 and 255 N-channel type MOS transistors N0 to N254 in accordance with the values of the 8-bit digital codes (bits 7 to 0).

The switch control circuit 105 controls the turn-on and turn-off of 128 P-channel type MOS transistors P128 to P255 and 128 N-channel type MOS transistors N0 to N127 which are located at the first stage in accordance with a value of bit 7 in the digital codes.

Only one of two P-channel type MOS transistors P(2m−1) and P(2m−2) (m=65 to 128) which are located at the first stage is turned on. The switch control circuit 105 turns on the P-channel type MOS transistor P(2m−1) in a case where bit 7 is "1", and turns on the P-channel type MOS transistor P(2m−2) in a case of "0".

In addition, only one of two N-channel type MOS transistors N(2m−1) and N(2m−2) (m=1 to 64) which are located at the first stage is turned on. The switch control circuit 105 turns on the N-channel type MOS transistor N(2m−1) in a case where bit 7 is "1", and turns on the N-channel type MOS transistor N(2m−2) in a case of "0".

Here, 64 sets of two P-channel type MOS transistors P(2m−1) and P(2m−2) (m=65 to 128) and 64 sets of two N-channel type MOS transistors N(2m−1) and N(2m−2) (m=1 to 64) are all turned on and turned off by the same control logic. For example, eight P-channel type MOS transistors P255, P253, P251, P249, P247, P245, P243, and P241 and eight N-channel type MOS transistors N15, N13, N11, N9, N7, N5, N3, and N1 are simultaneously set to be in an on state or an off state.

The switch control circuit 105 controls the turn-on and turn-off of MOS transistors located at the second, third, fourth, fifth, sixth, seventh, and eighth stages in accordance with the value of bit 6, the value of bit 5, the value of bit 4, the value of bit 3, the value of bit 2, the value of bit 1, and the value of bit 0 in the digital codes, by the same logic as that used to control the turn-on and turn-off of the MOS transistors located at the first stage.

The D/A conversion circuit 100 of the second embodiment which is configured in this manner selects any one of 256 types of voltages obtained by dividing a reference voltage Vref by the resistors R0 to R255 in accordance with 8-bit digital codes, and outputs the selected voltage to the outside through the operational amplifier 106.

As described above, in the D/A conversion circuit 100, 255 switches each of which is electrically connected to one end of a resistor on the higher potential side than the resistor R127 are all constituted by a P-channel type MOS transistor, and 255 switches each of which is electrically connected to one end of a resistor on the lower potential side than the resistor RM127 are all constituted by an N-channel type MOS transistor. Accordingly, an area occupied by the switches on a semiconductor substrate is reduced to approximately a half, compared to a case where all of the 510 switches are constituted by a complementary analog switch (transfer gate).

In addition, the accuracy of the output voltage of the D/A conversion circuit 100 depends on not only resistance values of the respective resistors R0 to R255 but also differences between the resistance values. For this reason, in the layout design of the D/A conversion circuit 100, the length of a resistive element, having a constant width, which constitutes the resistors R0 to R255 can be matched to the width in a longitudinal direction of a region in which 256 MOS transistors located at the first stage are arranged. In other words, in order to make the layout area of the D/A conversion circuit 100 as small as possible, it is important to efficiently dispose 256 MOS transistors located at the first stage with as small an area as possible.

In order to efficiently dispose the MOS transistors, for example, it is preferable to dispose a P-channel type MOS transistor on one side surface side of the resistive element in the longitudinal direction and to commonize the drain of a P-channel type MOS transistor P(2j+1) (j=64 to 127) and the drain of a P-channel type MOS transistor P(2j). Similarly, it is preferable to dispose an N-channel type MOS transistor on the same side surface side of the resistive element in the longitudinal direction and to commonize the source of an N-channel type MOS transistor N (2j+1) (j=0 to 63) and the source of an N-channel type MOS transistor N(2j). In addition, it is preferable to match a pitch of a contact (equivalent to a terminal of each resistor) which is formed in the resistive element in the longitudinal direction to both a pitch of a source contact of a P-channel type MOS transistor and a pitch of a drain contact of an N-channel type MOS transistor.

Figure 7:
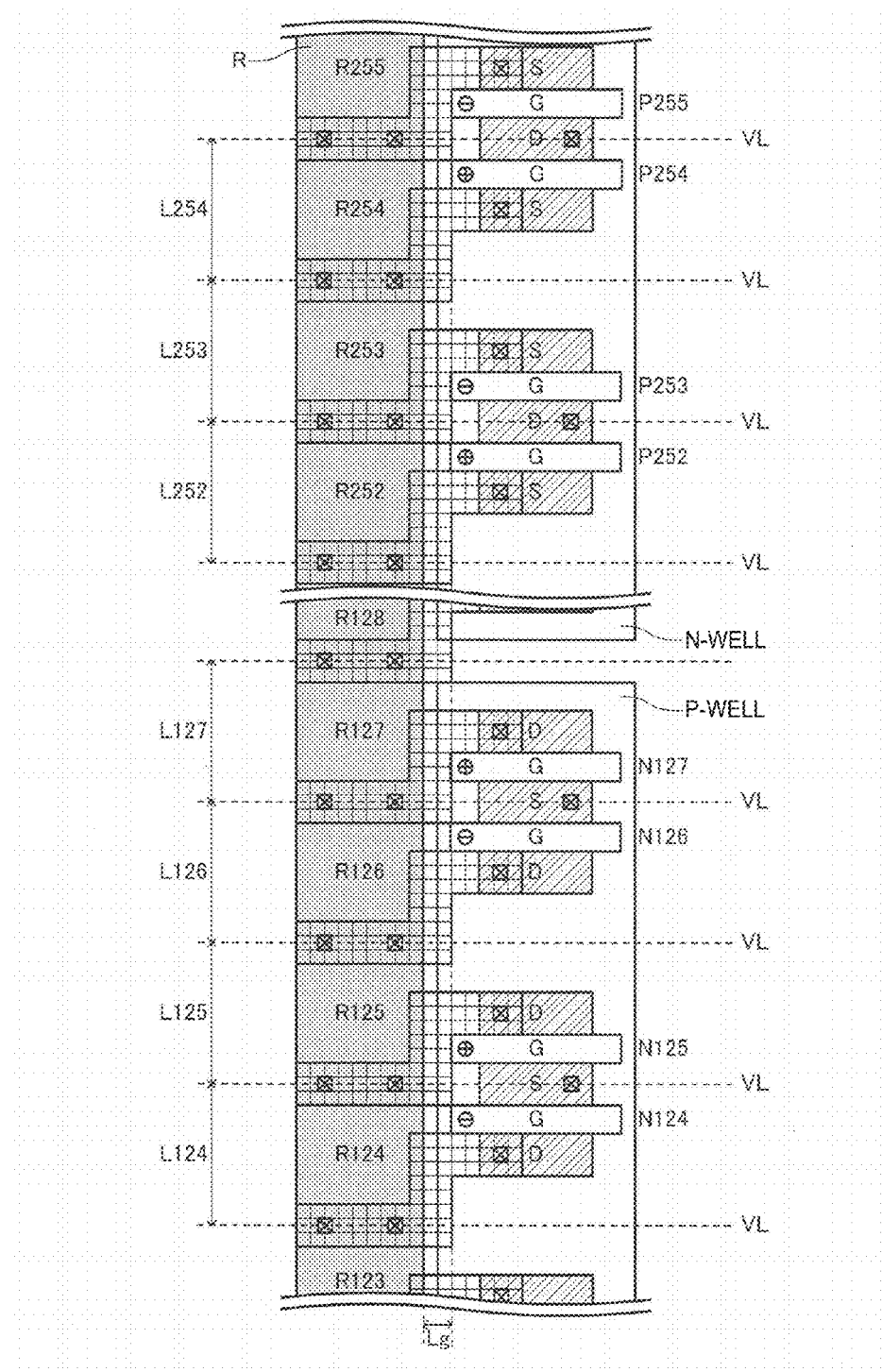
FIG. 7 is a diagram illustrating the layout of a portion of the D/A conversion circuit according to the second embodiment.

In the second embodiment, as illustrated in FIG. 7, the MOS transistors are further disposed so that a virtual straight line VL perpendicular to the longitudinal direction of the resistive element R passes between gate electrodes of two adjacent MOS transistors through the contacts provided in the resistive element R, when seen in a plan view of the semiconductor substrate, on the assumption of the layout taking these conditions into consideration.

By this arrangement, gate electrodes of different MOS transistors face the side surfaces of the respective resistors R0 to R255 when seen in a plan view of the semiconductor substrate. The potentials of the gate electrodes, facing the respective resistors R0 to R255, which are in an L level and an H level are alternately repeated under the control of the switch control circuit 105. For example, when bit 7 in the digital codes is "1", odd-numbered P-channel type MOS transistors P255, P253, . . . , and P129 and odd-numbered N-channel type MOS transistors N127, N125, . . . , and N1 are set to be in an on state, and even-numbered P-channel type MOS transistors P254, P252, . . . , and P128 and even-numbered N-channel type MOS transistors N126, N124, . . . , and N0 are set to be in an off state. In addition, when bit 7 in the digital codes is "0", even-numbered P-channel type MOS transistors P254, P252, . . . , and P128 and even-numbered N-channel type MOS transistors N126, N124, . . . , and N0 are set to be in an on state, and odd-numbered P-channel type MOS transistors P255, P253, . . . , and P129 and odd-numbered N-channel type MOS transistors N127, N125, . . . , and N1 are set to be in an off state.

That is, adjacent gate electrodes are always set to be in different potential states irrespective of values in digital codes, which results in a difference between electrical fields applied to two adjacent resistors, and thus there is a concern of differential non-linearity (DNL) slightly deteriorating. However, since an average value of force fields applied to the resistors R128 to R255 is the same as an average value of electrical fields applied to the resistors R128 to R255, INL does not have a V shape with a central code as a boundary. Accordingly, INL is improved, and a deterioration in the output accuracy of the D/A conversion circuit 100 is reduced.

In addition, as in the first embodiment, a layout area for disposing the dummy electrodes DM0 to DM255 is not increased. In addition, an interval (distance) between the resistive element R and each gate electrode may be set to be a value contrary to a design rule insofar as an average value of force fields applied to the resistors R128 to R255 is the same as an average value of electrical fields applied to the resistors R128 to R255, and can be reduced to, for example, a value equal to or less than 1 μm. Thereby, it is possible to reduce the layout area of the D/A conversion circuit 100.

As described above, according to the D/A conversion circuit 100 of the second embodiment, as an average value of force fields applied to the resistors R128 to R255 and an average value of electrical fields applied to the resistors R128 to R255 are set to be the same value, and thus INL is improved, and it is possible to improve the accuracy of an output voltage.

In addition, according to the D/A conversion circuit 100 of the second embodiment, the resistive element R can be disposed to be closer to the gate electrode of each MOS transistor as the degree of contravention of a design rule becomes higher, and thus a reduction in size can be achieved.

Therefore, according to the second embodiment, it is possible to realize the D/A conversion circuit which is highly accurate and has a small size.

2. Oscillator

Figure 8:
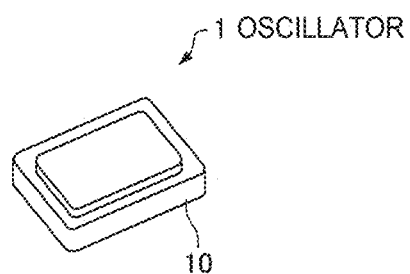
FIG. 8 is a perspective view of an oscillator according to the present embodiment.
Figure 9:
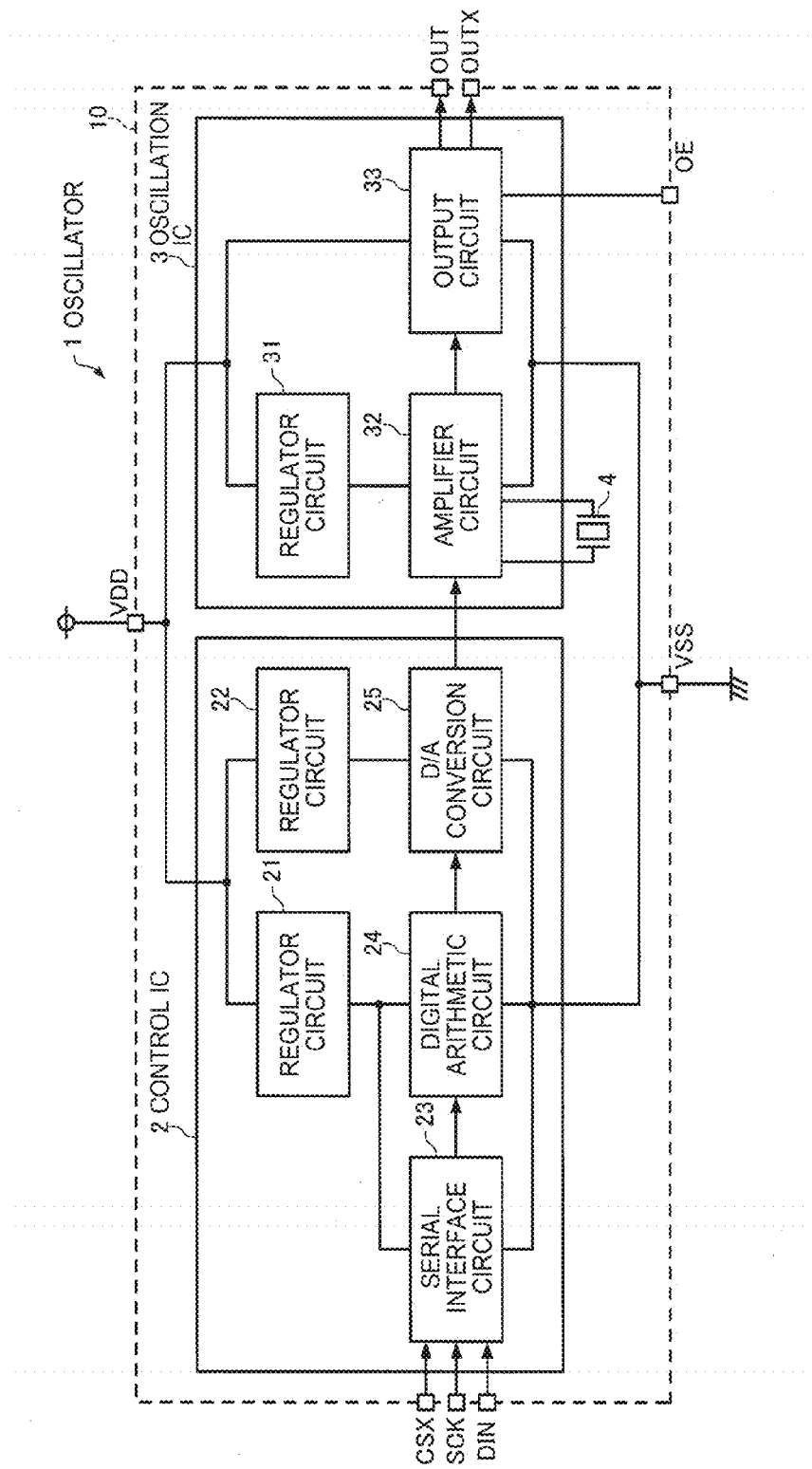
FIG. 9 is a diagram illustrating a configuration of the oscillator according to the present embodiment.

FIG. 8 is a perspective view of an oscillator according to the present embodiment. In addition, FIG. 9 is a diagram illustrating a configuration of an oscillator according to the present embodiment. An oscillator 1 according to the present embodiment is a digital control oscillator capable of controlling an oscillating frequency in response to a digital signal which is input from an external terminal, and is configured to include a control integrated circuit (IC) 2, an oscillation integrated circuit (IC) 3, a crystal vibrator 4, and a package (container) 10 mounted with the control IC 2, the oscillation IC 3, and the crystal vibrator 4, as illustrated in FIGS. 8 and 9.

The control IC 2 operates with a power voltage VDD being supplied to the power terminal thereof from a power terminal VDD of the oscillator 1 and a ground potential VSS being supplied to the ground terminal thereof from a ground terminal GND. Similarly, the oscillation IC 3 operates with a power voltage VDD being supplied to the power terminal thereof from the power terminal VDD of the oscillator 1 and a ground potential VSS being supplied to the ground terminal thereof from the ground terminal GND.

As illustrated in FIG. 9, the control IC 2 is configured to include a regulator circuit 21, a regulator circuit 22, a serial interface circuit 23, a digital arithmetic circuit 24, and a D/A conversion circuit 25.

The regulator circuit 21 is a voltage regulator that generates a constant voltage from the power voltage VDD and supplies the generated voltage to the serial interface circuit 23 and the digital arithmetic circuit 24.

The regulator circuit 22 is a voltage regulator that generates a constant voltage from the power voltage VDD and supplies the generated voltage to a power supply node of the D/A conversion circuit 25, or is a current regulator that generates a constant current from the power voltage VDD and supplies the generated current to the power supply node of the D/A conversion circuit 25.

The serial interface circuit 23 receives a chip select signal, a serial data signal, and a clock signal which are respectively input from three external terminals CSX, SCK, and DAIN of the oscillator 1 through three terminals of the control IC 2, acquires a serial data signal in synchronization with a clock signal when the chip select signal is in an active state, and outputs the acquired signal to the digital arithmetic circuit 24. The serial interface circuit 23 may be an interface circuit corresponding to, for example, a serial peripheral interface (SPI). Meanwhile, in the present embodiment, the serial interface circuit 23 is a three-wire type interface circuit, but is not limited thereto. For example, the serial interface circuit may be a two-wire type interface circuit corresponding to an inter-integrated circuit (I$^2$C).

The digital arithmetic circuit 24 converts a serial data signal output by the serial interface circuit 23 into an N-bit data signal, and outputs the converted signal.

The D/A conversion circuit 25 converts an N-bit data signal output by the digital arithmetic circuit 24 into an analog signal to thereby generate a control signal for controlling the oscillation IC 3, and outputs the generated signal from a terminal of the control IC 2. For example, a resistance voltage division type circuit can be used as the D/A conversion circuit 25.

The oscillation IC 3, which is connected to the crystal vibrator 4, resonates the crystal vibrator 4 with a frequency in response to a control signal output by the control IC 2 and outputs an oscillation signal. The oscillation signal is output to the outside of the oscillator 1 as a differential oscillation signal through two external terminals OUT and OUTX of the oscillator 1. In addition, the oscillation IC 3 controls a resonance frequency of the crystal vibrator 4 under the control of the control IC 2.

Meanwhile, the crystal vibrator 4 is an example of a resonator, and another resonator may be used instead of the crystal vibrator 4. The resonator may be an electrical resonance circuit, or may be an electromechanical resonator, or the like. The resonator may be, for example, a vibrator. The vibrator may be, for example, a piezoelectric vibrator, a surface acoustic wave (SAW) resonator, a micro electro mechanical systems (MEMS) vibrator, or the like. In addition, examples of a substrate material of the vibrator include a piezoelectric material such as piezoelectric single crystal, such as crystal, lithium tantalate or lithium niobate, or piezoelectric ceramics such as lead zirconate titanate, a silicon semiconductor material, and the like. As excitation means of the vibrator, means using a piezoelectric effect may be used, or electrostatic driving using Coulomb force may be used. In addition, the resonator may be an optical resonator that uses a gas cell having an alkali metal and the like accommodated therein and light interacting with atoms such as an alkali metal, a cavity resonator or a dielectric resonator which resonates in a microwave range, an LC resonator, or the like.

As illustrated in FIG. 9, the oscillation IC 3 is configured to include a regulator circuit 31, an amplifier circuit 32, and an output circuit 33.

The regulator circuit 31 is a current regulator that generates a constant current from a power voltage VDD and supplies the generated current to a power supply node of the amplifier circuit 32, or is a voltage regulator that generates a constant voltage from a power voltage VDD and supplies the generated voltage to the power supply node of the amplifier circuit 32.

The amplifier circuit 32 amplifies a signal output from the crystal vibrator 4 by, for example, a bipolar transistor operating by a current supplied from the regulator circuit 31, and feeds the amplified signal back to the crystal vibrator 4, thereby resonating the crystal vibrator 4. Alternatively, the amplifier circuit 32 may amplify a signal output from the crystal vibrator 4 by a CMOS inverter element operating by a voltage supplied from the regulator circuit 31, and feeds the amplified signal back to the crystal vibrator 4, thereby resonating the crystal vibrator 4.

The amplifier circuit 32 includes a variable capacitance element, not shown in the drawing, which functions as a load capacitance of the crystal vibrator 4. A voltage (control voltage) of a control signal output by the control IC 2 is applied to the variable capacitance element through a terminal of the oscillation IC 3, and the capacitance value thereof is controlled by the control voltage. An oscillating frequency of the crystal vibrator 4 varies depending on the capacitance value of the variable capacitance element.

Meanwhile, various oscillation circuits such as a pierced oscillation circuit, an inverter type oscillation circuit, a Colpitts oscillation circuit, and a Hartley oscillation circuit may be constituted by the amplifier circuit 32 and the crystal vibrator 4.

The output circuit 33 generates, for example, an oscillation signal by performing buffering or level shifting of a signal (input circuit of the crystal vibrator 4) which is amplified by the amplifier circuit 32, and outputs the generated signal. The output circuit 33 generates a differential oscillation signal corresponding to any of standards such as a low-voltage positive-referenced emitter coupled logic (LVPECL), low-voltage differential signals (LVDS), a high-speed current steering logic (HCSL). The output circuit 33 outputs an oscillation signal from two terminals of the oscillation IC 3 when an external terminal OE is in a high (H) level, and stops outputting an oscillation signal when the external terminal OE is in a low (L) level. The differential oscillation signal output from the oscillation IC 3 is output to the outside from two external terminals OUT and OUTX of the oscillator 1. Meanwhile, the output circuit 33 may generate a single-end oscillation signal such as a CMOS-level oscillation signal, and may output the generated signal to the outside from the external terminal OUT. In this case, the external terminal OUTX is not necessary.

The amplifier circuit 32, or the amplifier circuit 32 and the output circuit 33 function as an oscillation circuit for resonating the crystal vibrator 4.

The oscillation circuit constituted by the oscillation IC 3 and the crystal vibrator 4 functions as a voltage control crystal oscillation circuit that outputs an oscillation signal having a frequency in response to a voltage (control voltage) of a control signal output by the control IC 2.

Figure 10:
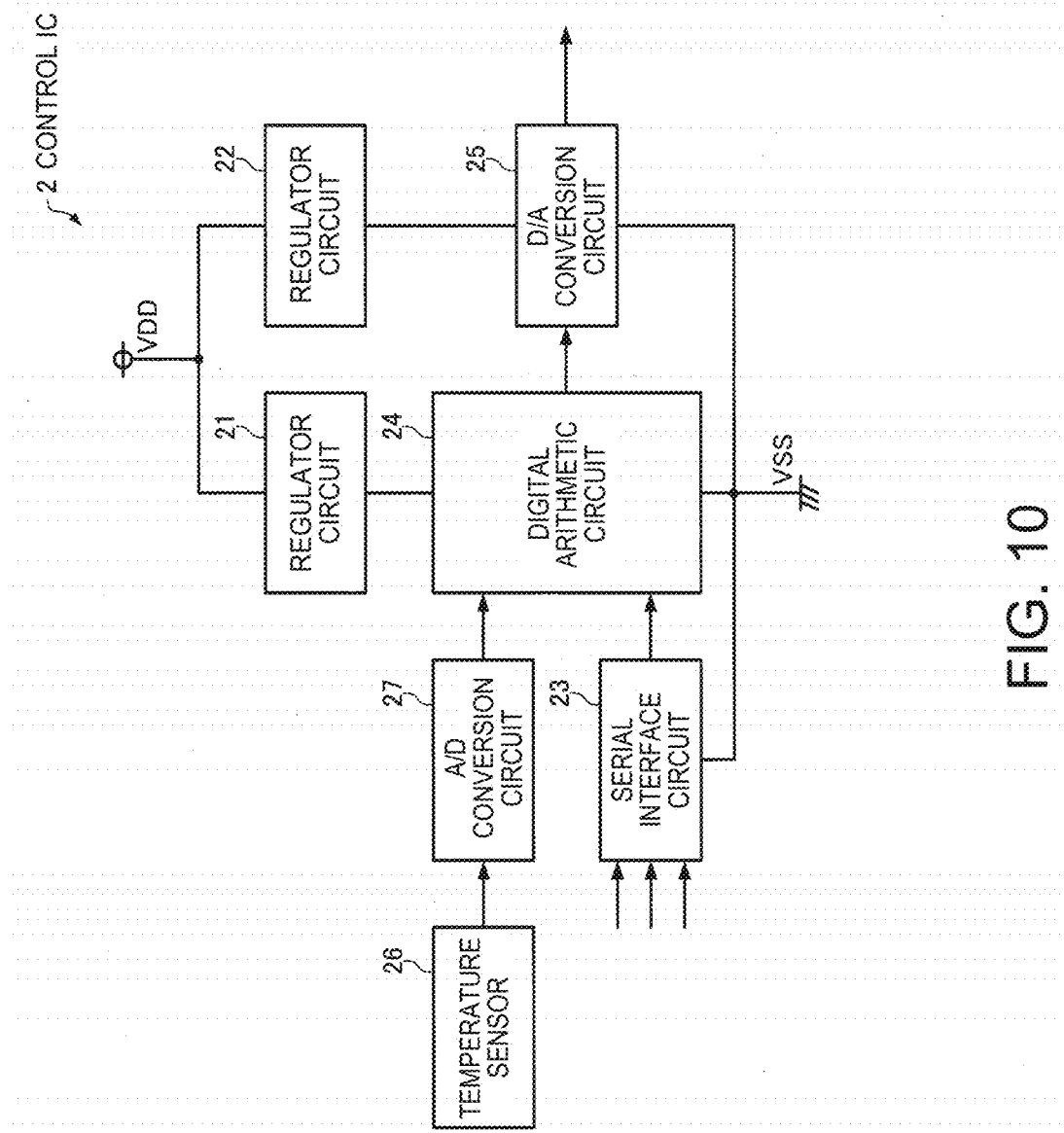
FIG. 10 is a diagram illustrating another configuration of a control IC in the oscillator according to the present embodiment.

In addition, the oscillator 1 according to the present embodiment may be configured such that the control IC 2 of FIG. 9 is replaced with a configuration of FIG. 10. In the example of FIG. 10, the control IC 2 may be configured to include a regulator circuit 21, a regulator circuit 22, a serial interface circuit 23, a digital arithmetic circuit 24, a D/A conversion circuit 25, a temperature sensor 26, and an A/D conversion circuit (analog to digital converter: ADC) 27.

The temperature sensor 26 is a temperature-sensitive element that outputs a signal (for example, a voltage depending on temperature) in response to an ambient temperature, and is realized by, for example, a configuration in which one or a plurality of diodes are connected to each other in series in a forward direction between the output thereof and a ground.

The A/D conversion circuit 27 converts an output signal of the temperature sensor 26 into a digital signal and outputs the converted signal. Various types of well-known circuits such as a parallel comparison type, a successive comparison type, a delta-sigma type, and a double integration type can be used as the A/D conversion circuit 27.

The digital arithmetic circuit 24 calculates a digital value of a temperature compensation voltage for compensating for frequency temperature characteristics of the crystal vibrator 4 using an output signal of the A/D conversion circuit 27, converts a serial data signal output by the serial interface circuit 23 into an N-bit digital value, adds up the digital value and the digital value of the temperature compensation voltage to thereby generate an N-bit data signal, and outputs the generated signal.

The D/A conversion circuit 25 converts the N-bit data signal into an analog signal to thereby generate a control signal for controlling the oscillation IC 3, and outputs the generated signal from a terminal of the control IC 2.

The oscillator 1 is a digital control temperature compensation type oscillator that maintains an oscillating frequency substantially constant irrespective of temperature and is capable of controlling an oscillating frequency in response to a digital signal which is input from an external terminal.

Meanwhile, the oscillator 1 according to the present embodiment is constituted by two chips of the control IC 2 and the oscillation IC 3, but may be constituted by an IC of one chip or may be constituted by ICs of three or more chips.

In the oscillator 1 according to the present embodiment, the D/A conversion circuit 100 of each of the above-described embodiments are used as the D/A conversion circuit 25, and thus it is possible to realize the oscillator which is highly accurate and has a small size.

3. Electronic Apparatus

Figure 11:
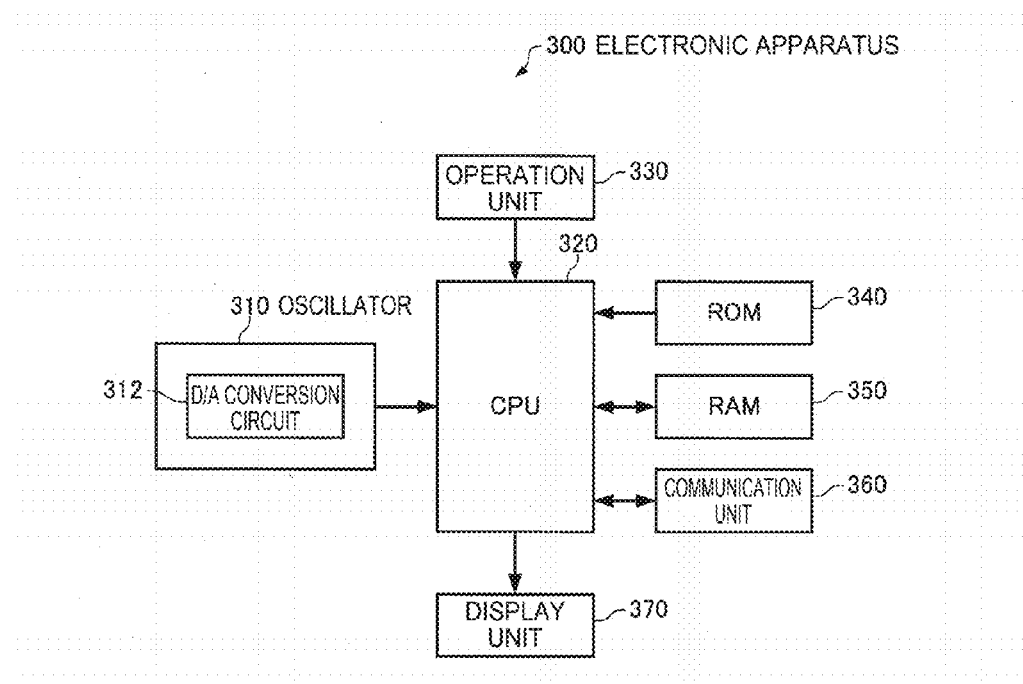
FIG. 11 is a functional block diagram illustrating an example of a configuration of an electronic apparatus according to the present embodiment.

FIG. 11 is a functional block diagram illustrating an example of a configuration of an electronic apparatus according to the present embodiment. An electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. Meanwhile, the electronic apparatus according to the present embodiment has a configuration in which some of components (respective portions) of FIG. 11 are omitted or changed, or may have a configuration in which other components are added.

The oscillator 310 has a resonator (not shown), an oscillation circuit (not shown) that resonates the resonator, and a D/A conversion circuit 312 for controlling the oscillation circuit which are built therein, and outputs an oscillation signal by the resonation of the resonator. The oscillation signal is supplied to the CPU 320 from the oscillator 310.

The CPU 320 performs various types of computation processes and control processes using an oscillation signal input from the oscillator 310 as a clock signal in accordance with a program stored in the ROM 340 or the like. Specifically, the CPU 320 performs various types of processes in response to an operation signal from the operation unit 330, a process of controlling the communication unit 360 in order to perform data communication with an external device, a process of transmitting a display signal for causing the display unit 370 to display a variety of information, and the like.

The operation unit 330 is an input device constituted by operation keys, button switches or the like, and outputs an operation signal in response to a user's operation to the CPU 320.

The ROM 340 stores a program, data or the like for causing the CPU 320 to perform various types of computation processes and control processes.

The RAM 350 is used as a work area of the CPU 320, and temporarily stores a program and data which are read out from the ROM 340, data which is input from the operation unit 330, arithmetic operation results executed by the CPU 320 in accordance with various types of programs, and the like.

The communication unit 360 performs a variety of control for establishing data communication between the CPU 320 and an external device.

The display unit 370 is a display device constituted by a liquid crystal display (LCD) or the like, and displays a variety of information on the basis of a display signal which is input from the CPU 320. The display unit 370 may be provided with a touch panel that functions as the operation unit 330.

For example, the D/A conversion circuit 100 of each of the above-described embodiments are used as the D/A conversion circuit 312, and thus it is possible to realize the electronic apparatus with high reliability.

Various electronic apparatuses are considered as the electronic apparatus 300, and examples of the electronic apparatuses include a personal computer (for example, mobile-type personal computer, laptop personal computer, or tablet personal computer), a mobile terminal such as a smartphone or a mobile phone, a digital still camera, an ink jet ejecting apparatus (for example, ink jet printer), a digital phase locked loop (PLL), a communication network device (for example, a storage area network device such as a router or a switch, or a local area network device), a device for a base station of a mobile terminal, a television, a video camera, a video tape recorder, a car navigation device, a real-time clock device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish detector, various types of measuring apparatus, meters and gauges (for example, meters and gauges of a vehicle, an aircraft, and a vessel), a flight simulator, a head mounted display, a motion tracer, a motion tracker, a motion controller, PDR (walker position and direction measurement), and the like.

An example of the electronic apparatus 300 according to the present embodiment includes a transmission device functioning as a device for a base station of a terminal which performs communication with a terminal, for example, in a wired or wireless manner using the oscillator 310 mentioned above a reference signal source, a voltage variable oscillator (VCO), or the like. The electronic apparatus 300 according to the present embodiment can also be applied to a transmission device, desired to have high performance and high reliability, which is capable of being used in, for example, a communication base station by using, for example, the oscillator 1 of the above-described embodiment including the D/A conversion circuit 100 of each of the above-described embodiments as the oscillator 310.

4. Moving Object

Figure 12:
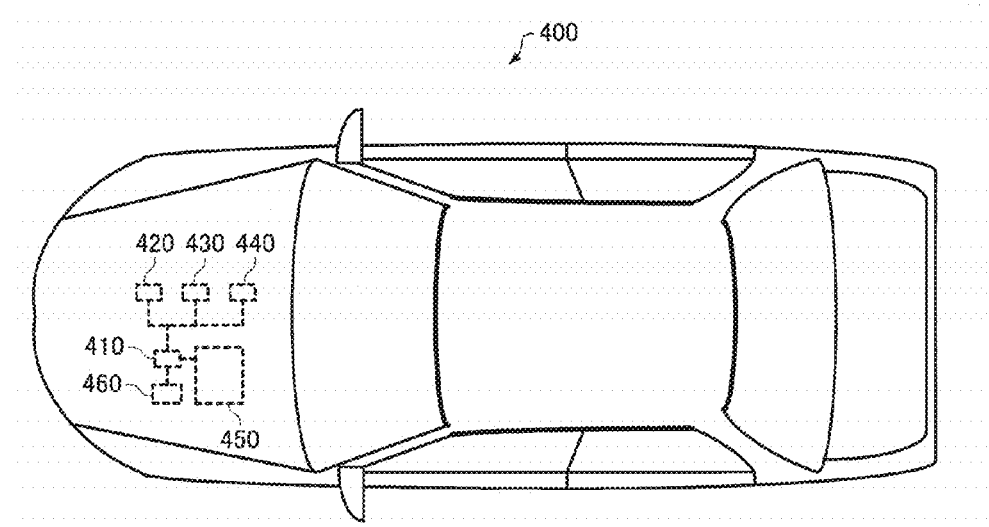
FIG. 12 is a diagram illustrating an example of a moving object according to the present embodiment.

FIG. 12 is a diagram (top view) illustrating an example of a moving object according to the present embodiment. A moving object 400 illustrated in FIG. 12 is configured to include an oscillator 410, controllers 420, 430, and 440 that perform a variety of control of an engine system, a brake system, a keyless entry system and the like, a battery 450, and a battery 460 for backup. Meanwhile, the moving object of the present embodiment may have a configuration in which some of the components (the respective portions) of FIG. 12 are omitted or changed, and may have a configuration in which other components are added.

The oscillator 410 has a resonator (not shown), an oscillation circuit (not shown) that resonates the resonator, and a D/A conversion circuit for controlling the oscillation circuit which are embedded therein, and outputs an oscillation signal by the resonation of the resonator. The oscillation signal is supplied to the controllers 420, 430, and 440 from the oscillator 410, and is used as, for example, a clock signal.

The battery 450 supplies power to the oscillator 410 and the controllers 420, 430, and 440. The battery 460 for backup supplies power to the oscillator 410 and the controllers 420, 430, and 440 when an output voltage of the battery 450 becomes lower than a threshold value.

For example, the D/A conversion circuit 100 of each of the above-described embodiments is used as the D/A conversion circuit built in the oscillator 410, and thus it is possible to realize the moving object with high reliability.

Various moving objects are considered as the moving object 400. Examples of the moving object include an automobile (also including an electric automobile), an aircraft such as a jet engine airplane or a helicopter, a vessel, a rocket, a satellite, and the like.

The invention is not limited to the present embodiment, and various changes and modifications can be made without departing from the scope of the invention.

Each of the above-described embodiments is an example, and is not limited thereto. For example, the embodiments can also be appropriately combined.

The invention includes configurations (for example, configurations having the same functions, methods and results, or configurations having the objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2015-007934, filed Jan. 19, 2015 is expressly incorporated by reference herein.

What is claimed is:

1. A D/A conversion circuit comprising:
    a plurality of resistors that are constituted by a resistive element and a plurality of contacts provided in the resistive element, and are connected to each other in series;
    a plurality of MOS transistors that are connected to the plurality of contacts, respectively; and
    a plurality of dummy electrodes that are different from electrodes of the plurality of MOS transistors, which are respectively disposed on sides opposite to the plurality of MOS transistors with the resistive element interposed therebetween, when seen in a plan view of a semiconductor substrate,
    wherein the plurality of resistors, the plurality of MOS transistors, and the plurality of dummy electrodes are formed on the semiconductor substrate,
    wherein each of the plurality of dummy electrodes is set to be in a second potential state when a gate electrode of the MOS transistor disposed on a side opposite thereto with the resistive element interposed therebetween is in a first potential state, and is set to be in a first potential state when the gate electrode of the MOS transistor is in a second potential state, and
    wherein one of the first potential and the second potential is a potential that allows electrical conduction of the MOS transistor, and the other is a potential that does not allow electrical conduction of the MOS transistor.

2. The D/A conversion circuit according to claim 1, wherein each of the plurality of dummy electrodes is formed of polysilicon.

3. The D/A conversion circuit according to claim 1, wherein a distance between the resistive element and the gate electrode of the MOS transistor is equal to or less than 1 μm.

4. The D/A conversion circuit according to claim 1, further comprising a control unit that controls a potential of each of the plurality of dummy electrodes.

5. The D/A conversion circuit according to claim 1,
    wherein each of the plurality of MOS transistors is a P-channel type MOS transistor or an N-channel type MOS transistor,
    wherein in a first resistor among the plurality of resistors, a terminal on a high potential side is connected to the P-channel type MOS transistor, and a terminal on a low potential side is connected to the N-channel type MOS transistor,
    wherein in resistors on a higher potential side than the first resistor among the plurality of resistors, one side ends thereof are connected to the P-channel type MOS transistors different from each other, and
    wherein in resistors on a lower potential side than the first resistor among the plurality of resistors, one side ends thereof are connected to the N-channel type MOS transistors different from each other.

6. The D/A conversion circuit according to claim 5,
    wherein the resistors on the higher potential side than the first resistor face the P-channel type MOS transistors connected to terminals on the low potential side, and
    wherein the resistors on the lower potential side than the first resistor face the N-channel type MOS transistors connected to terminals on the high potential side.

7. An oscillator including the D/A conversion circuit according to claim 1.

8. An oscillator including the D/A conversion circuit according to claim 2.

9. An oscillator including the D/A conversion circuit according to claim 3.

10. An oscillator including the D/A conversion circuit according to claim 4.

11. An electronic apparatus including the D/A conversion circuit according to claim 1.

12. An electronic apparatus including the D/A conversion circuit according to claim 2.

13. An electronic apparatus including the D/A conversion circuit according to claim 3.

14. An electronic apparatus including the D/A conversion circuit according to claim 4.

15. A moving object including the D/A conversion circuit according to claim 1.

16. A moving object including the D/A conversion circuit according to claim 2.

17. A moving object including the D/A conversion circuit according to claim 3.

18. A moving object including the D/A conversion circuit according to claim 4.

* * * * *